US012660311B2

(12) United States Patent
Anderson et al.

(10) Patent No.: US 12,660,311 B2
(45) Date of Patent: Jun. 16, 2026

(54) AIR POCKET BETWEEN TOP AND BOTTOM SOURCE/DRAIN REGIONS

(71) Applicant: INTERNATIONAL BUSINESS MACHINES CORPORATION, Armonk, NY (US)

(72) Inventors: Brent A. Anderson, Jericho, VT (US); Ruilong Xie, Niskayuna, NY (US); Junli Wang, Slingerlands, NY (US); Jay William Strane, Wappingers Falls, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 525 days.

(21) Appl. No.: 18/297,996

(22) Filed: Apr. 10, 2023

(65) Prior Publication Data

US 2024/0339452 A1    Oct. 10, 2024

(51) Int. Cl.
H10D 84/85 (2025.01)
H10D 30/01 (2025.01)
(Continued)

(52) U.S. Cl.
CPC ......... H10D 84/856 (2025.01); H10D 30/014 (2025.01); H10D 30/43 (2025.01);
(Continued)

(58) Field of Classification Search
CPC ...... H10D 30/025; H10D 30/63; H10D 84/85; H10D 88/00; H10D 88/01
See application file for complete search history.

(56) References Cited

U.S. PATENT DOCUMENTS 9,659,963 B2    5/2017    Cheng
9,837,414 B1    12/2017    Balakrishnan
(Continued)

FOREIGN PATENT DOCUMENTS

KR        20170108259 A        9/2017

OTHER PUBLICATIONS

Wang, et al., "Vacuum Inner Spacer to Improve Annealing Effect during Electro-Thermal Annealing of Nanosheet FETs." Published Jun. 24, 2022. 9 pages. In Micromachines 2022, 13, 987. https://doi.org/10.3390/mi13070987.

Primary Examiner — Fernando L Toledo
Assistant Examiner — Adam S Bowen
(74) Attorney, Agent, or Firm — Seed Intellectual Property Law Group LLP

(57) ABSTRACT

An air pocket is located between a top S/D region and a bottom S/D region of a stacked transistor. The air pocket reduces the parasitic capacitance between the top S/D region and the bottom S/D region, reduces the capacitance between the gate and the top S/D region, and/or reduces the capacitance between the gate and the bottom S/D region. Reduction of such capacitance(s) may improve performance of the semiconductor IC device and may allow for further semiconductor IC device scaling. A semiconductor IC device may include a bottom transistor and a top transistor. The top transistor may be vertically stacked, or aligned, with respect to the bottom transistor. The air pocket is located between, and may be vertically aligned with, the top S/D region and the bottom S/D region.

18 Claims, 18 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 64/23* | (2025.01) |
| *H10D 84/01* | (2025.01) |
| *H10D 84/03* | (2025.01) |

(52) U.S. Cl.

CPC ..... *H10D 30/6729* (2025.01); *H10D 30/6735* (2025.01); *H10D 30/6757* (2025.01); *H10D 62/121* (2025.01); *H10D 62/151* (2025.01); *H10D 64/021* (2025.01); *H10D 64/258* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 64/017* (2025.01)

(56) References Cited

U.S. PATENT DOCUMENTS

| 10,192,867 | B1 | | 1/2019 | Frougier | |
|---|---|---|---|---|---|
| 10,461,195 | B2 | | 10/2019 | Kwon | |
| 10,930,749 | B2 | | 2/2021 | Jeon | |
| 11,069,684 | B1 | * | 7/2021 | Xie | ................... H01L 21/02603 |
| 11,164,952 | B2 | | 11/2021 | Lu | |
| 11,233,119 | B2 | | 1/2022 | Peng | |
| 2020/0098756 | A1 | | 3/2020 | Lilak | |
| 2020/0411639 | A1 | | 12/2020 | Mannebach | |
| 2022/0367620 | A1 | | 11/2022 | Yang | |

* cited by examiner

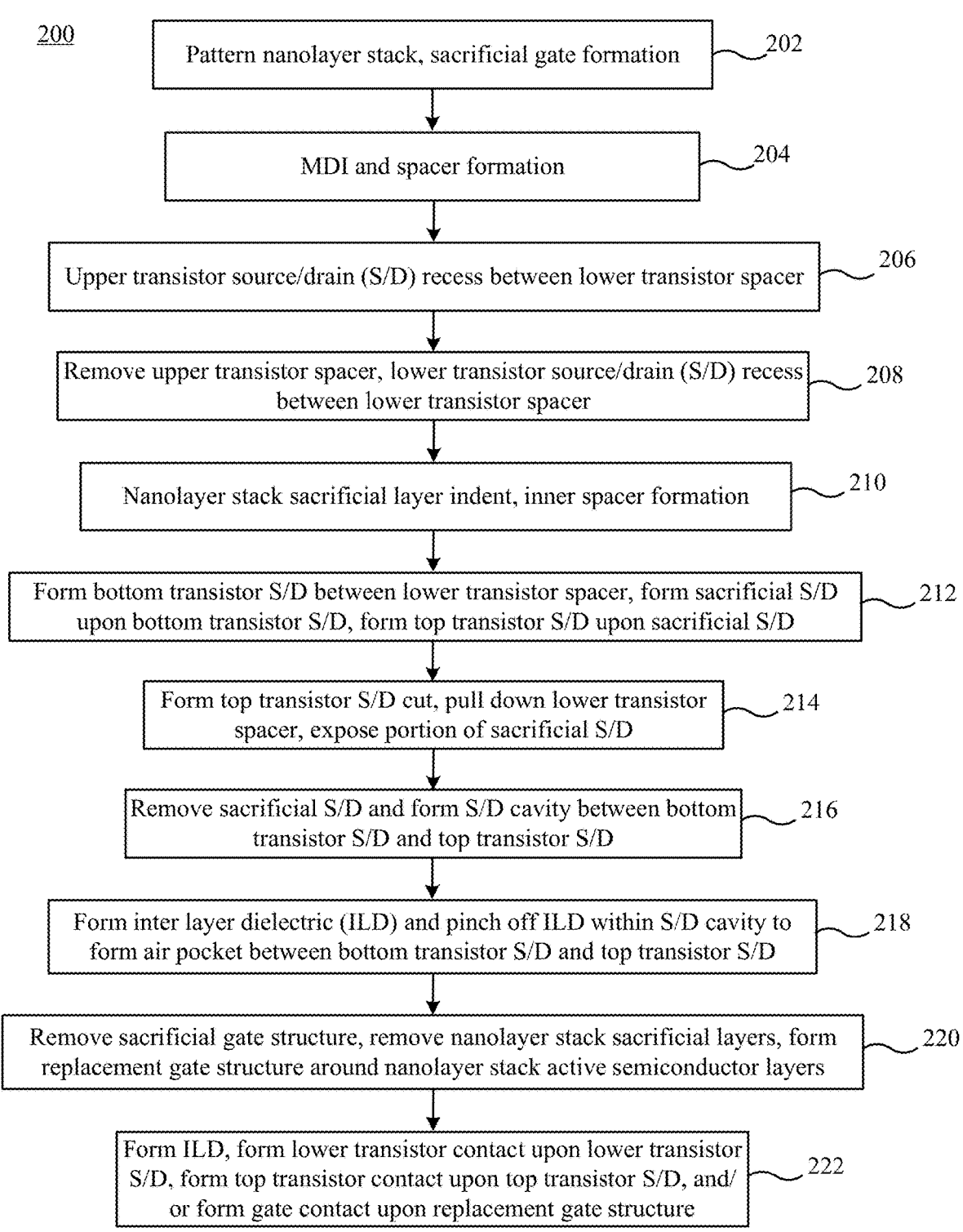

200

Pattern nanolayer stack, sacrificial gate formation — 202

MDI and spacer formation — 204

Upper transistor source/drain (S/D) recess between lower transistor spacer — 206

Remove upper transistor spacer, lower transistor source/drain (S/D) recess between lower transistor spacer — 208

Nanolayer stack sacrificial layer indent, inner spacer formation — 210

Form bottom transistor S/D between lower transistor spacer, form sacrificial S/D upon bottom transistor S/D, form top transistor S/D upon sacrificial S/D — 212

Form top transistor S/D cut, pull down lower transistor spacer, expose portion of sacrificial S/D — 214

Remove sacrificial S/D and form S/D cavity between bottom transistor S/D and top transistor S/D — 216

Form inter layer dielectric (ILD) and pinch off ILD within S/D cavity to form air pocket between bottom transistor S/D and top transistor S/D — 218

Remove sacrificial gate structure, remove nanolayer stack sacrificial layers, form replacement gate structure around nanolayer stack active semiconductor layers — 220

Form ILD, form lower transistor contact upon lower transistor S/D, form top transistor contact upon top transistor S/D, and/ or form gate contact upon replacement gate structure — 222

FIG. 18

AIR POCKET BETWEEN TOP AND BOTTOM SOURCE/DRAIN REGIONS

BACKGROUND

Various embodiments of the present disclosure generally relate to semiconductor integrated circuit (IC) device fabrication operations and resulting semiconductor IC devices. More specifically the various embodiments of the present disclosure relate to stacked transistors with an air pocket between a top source/drain (S/D) region and a bottom S/D region.

Conventional semiconductor IC devices, such as integrated circuits (ICs), or the like, incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk, however, conventional silicon device geometries and materials have had trouble maintaining switching speeds without incurring failures such as, for example, leaking current from the device into the semiconductor substrate. Several new technologies emerged that allowed chip designers to continue shrinking transistor sizes.

One particularly radical technology change entailed redesigning the structure of the FET from a planar device to a three-dimensional device in which the semiconducting channel was replaced by a fin that extends out from the plane of the substrate. In such a device, commonly referred to as a FinFET, the control gate wraps around three sides of the fin to influence current flow from three surfaces instead of one. The improved control achieved with a 3D design results in faster switching performance and reduced current leakage. Building taller devices has also permitted increasing the device density within the same footprint that had previously been occupied by a planar FET.

The FinFET concept was further extended by developing a gate all-around FET, or GAA FET, in which the gate fully wraps around one or more channels for maximum control of the current flow therein. In the GAA FET, the channels can take the form of nanowires, nanosheets, or the like, that are isolated from the substrate. In the GAA FET, channel surfaces are in respective contact with the source and drain and other respective channel surfaces are in contact with and surrounded by the gate.

State-of-the-art semiconductor IC devices include scaled or shrunk transistors that are approaching or at the physical limits of Moore's law. As transistors within semiconductor IC devices are scaled, various parasitic capacitances within the devices typically increase. Therefore, to continue to shrink semiconductor IC devices, techniques to reduce parasitic capacitance therewithin are desired.

SUMMARY

In an embodiment of the present disclosure, a semiconductor IC device is presented. The semiconductor IC device includes a bottom transistor and a top transistor vertically stacked above the bottom transistor. The semiconductor IC device includes an air pocket between a top source/drain (S/D) region of the top transistor and a bottom S/D region of the bottom transistor.

The air pocket reduces the parasitic capacitance between the top S/D region and the bottom S/D region, may reduce the capacitance between a gate and the top S/D region, and/or may reduce the capacitance between the gate and the bottom S/D region. Reduction of such capacitance(s) may improve performance of the semiconductor IC device and may allow for further semiconductor IC device scaling.

In some examples, the top S/D region, the air pocket, and the bottom S/D region are vertically aligned. In an example, the top S/D region and the bottom S/D region of the are increasingly or adequately electrically isolated from each other by the air pocket. In an example, the top transistor and the bottom transistor have a different polarity. For example, the top transistor is a nFET transistor and the bottom transistor is a pFET transistor, or vice versa. In an example, the top transistor and the bottom transistor share a common or same gate.

In an example, a first edge of the air pocket is aligned with a first sidewall of the top S/D region and wherein a second edge that is opposite facing to the first edge is aligned with a second sidewall of the top S/D region. In an example, a same interlayer dielectric (ILD) material is upon the first sidewall of the top S/D region and is upon the second sidewall of the top S/D region. In an example, the same ILD material defines a boundary of the air pocket.

In an example, a channel width of the bottom transistor is larger than a channel width of the top transistor. In an example, a width of the bottom S/D region that corresponds to the channel width of the bottom transistor is larger than a width of the top S/D region that corresponds to the channel width of the top transistor.

In an example, the semiconductor IC device includes a first spacer upon a first sidewall of the bottom S/D region and a second spacer upon a second sidewall of the bottom S/D region. In one example, a top surface of the first spacer is coplanar with a top surface of the second spacer. In an alternative example, a top surface of the first spacer is below a top surface of the second spacer.

In an example, a bottom S/D contact is connected to the bottom S/D region and to the first spacer. In an example, a top S/D contact is connected to the top S/D region. In an example, one or more top active semiconductor nanolayer channels are connected to the top S/D region and to the gate and one or more bottom active semiconductor nanolayer channels are connected to the bottom S/D region and to the gate.

In an example, the first sidewall of the top S/D region includes a crystallographic surface and wherein the second sidewall of the top S/D region includes an etched surface. In an example, the etched surface is vertical and/or is straight.

In another embodiment of the present disclosure, a semiconductor IC device fabrication method is presented. The fabrication method includes forming a bottom source/drain (S/D) region upon a substrate, forming a sacrificial S/D region upon the bottom S/D region, forming a top S/D region upon the sacrificial S/D region, removing the sacrificial S/D region, and forming an interlayer dielectric (ILD) between the top S/D region and the bottom S/D region pinching off the ILD to form an air pocket between the top S/D region and the bottom S/D region.

These and other embodiments, features, aspects, and advantages will become better understood with reference to the following description, appended claims, and accompanying drawings.

BRIEF DESCRIPTION OF THE DRAWINGS

FIG. 18 is a flow diagram illustrating a semiconductor IC device fabrication method to fabricate a semiconductor IC device that includes stacked transistors with an air pocket between a top S/D region and a bottom S/D region, in accordance with one or more embodiments of the disclosure.

DETAILED DESCRIPTION

Figure 1:
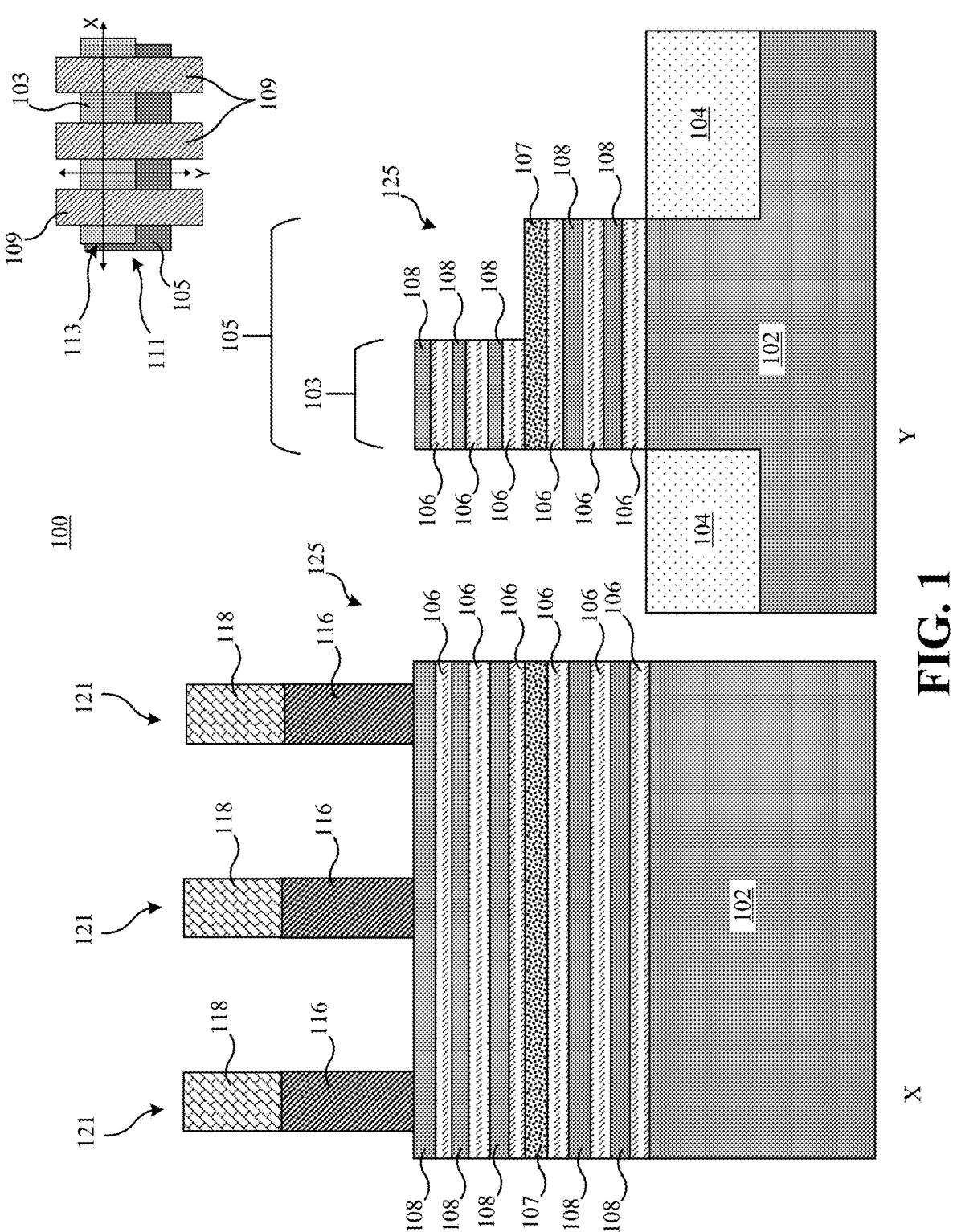
FIG. 1 through FIG. 17 depict fabrication views of a semiconductor IC device that includes stacked transistors with an air pocket between a top S/D region and a bottom S/D region, in accordance with one or more embodiments of the disclosure.

Embodiments of the disclosure recognize that reduction of parasitic capacitance within semiconductor IC devices is desirable. As such, the present disclosure provides a fabrication method to form an air pocket between a top S/D region and a bottom S/D region of a stacked transistor. The air pocket reduces the parasitic capacitance between the top S/D region and the bottom S/D region, reduces the capacitance between the gate and the top S/D region, and/or reduces the capacitance between the gate and the bottom S/D region. Reduction of such capacitance(s) may improve performance of the semiconductor IC device and may allow for further semiconductor IC device scaling.

Although this detailed description includes examples of how embodiments of the disclosure can be implemented to form an exemplary semiconductor IC device with stacked GAA FETs, implementation of the teachings recited herein are not necessarily limited to a particular type of FET structure or combination of materials depicted or described. Rather, embodiments of the present disclosure are capable of being implemented in conjunction with other transistor types or materials, now known or later developed, wherein it is desirable to reduce capacitance between the top S/D region, bottom S/D region, and/or the gate of a stacked transistor.

For the sake of brevity, conventional techniques related to semiconductor IC device fabrication may or may not be described in detail herein. Moreover, the various tasks and process steps described herein can be incorporated into a more comprehensive procedure or process having additional steps or functionality not described in detail herein. Various steps in the manufacture of semiconductor IC devices are well known and so, in the interest of brevity, many conventional steps will only be mentioned briefly herein or will be omitted entirely without providing the well-known process details.

In general, the various processes used to form a semiconductor IC device that will be packaged into a final or packaged IC, fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present disclosure, transistors are a type of microdevice commonly found in a wide variety of semiconductor IC devices. Typical semiconductor IC devices may be formed using active regions of a wafer. The active regions are defined by isolation regions used to separate and electrically isolate adjacent semiconductor IC devices. For example, in an IC having a plurality of GAA FETs, each GAA FET has a source and a drain that are formed in an active region of a semiconductor layer by implanting n-type or p-type impurities in the respective source and the drain material. Disposed between the source and the drain is a channel (or body) region. Disposed around the channel is the gate. The gate and the channel are spaced apart by a dielectric layer.

GAA FETs may be fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of a GAA FET is related to the electrical conductivity of the channel material. If the channel material has a relatively high conductivity, the GAA FET can be made with a correspondingly smaller wafer footprint. A known method of increasing channel conductivity and decreasing GAA FET size is to form the channel as a nanostructure, such as a nanowire or nanosheet. These GAA FETs provide a relatively small FET footprint by forming the channel as a series of vertical nanostructures.

In a known GAA configuration, a nanostructure-based FET includes a source region, a drain region, and stacked nanostructure channels between the source and drain regions. A gate surrounds the stacked nanostructure channels and regulates electron and hole flow through the nanostructure channels between the source and drain regions. GAA FETs may be fabricated by forming alternating layers of channel nanostructure and sacrificial nanostructure layers. The sacrificial nanostructure layers are released from the channel nanostructures before the GAA FET device is finalized. For n-type GAA FETs, the channel nanostructure layers may be silicon (Si) and the sacrificial nanostructure layers may be silicon germanium (SiGe). For p-type GAA FETs, in some implementations, the channel nanostructure layers may be SiGe and the sacrificial nanostructure layers may be Si. In other implementations, p-type GAA FETs, the channel nanostructure may be Si, and the sacrificial nano-structure can be SiGe.

In some implementations, the channel nanostructure layers may initially be Si and can be converted to SiGe or other material, after sacrificial nanostructure layers are removed.

Turning now to a more detailed description of fabrication operations and resulting structures according to embodiments of the disclosure, FIGS. 1-18 depict a semiconductor IC device 100 after various fabrication operations. For ease of illustration, the fabrication operations depicted therein will be described in the context of forming stacked transistors. The stacked transistors are fabricated to include a bottom transistor and a top transistor. The bottom transistor is fabricated to include a bottom S/D region and the top transistor is fabricated to include a top S/D region. The stacked transistors are further fabricated to include an air pocket between the bottom S/D region and the top S/D region. The fabrication operations described herein apply equally to the fabrication of any number and/or logical positioning of various FET types.

Although the cross-sectional structural diagrams depicted in the drawings are two-dimensional, it is understood that the diagrams depicted represent three-dimensional devices. The top-down reference diagram shown in FIG. 1 provides a reference point for various cross-sectional views (X-view, Y-view) shown in FIGS. 1-18. The X-view is a cross-sectional view taken along a nanolayer stack 125 across three gates 109 (e.g., sacrificial gates 116, etc.), the Y-view is another side cross-sectional view taken along a gate 109 across the nanolayer stack 125. The nanolayer stack 125 includes an upper transistor region 103 and a lower transistor region 105. The lower transistor region 105 may have a greater channel width relative to the upper transistor region 103, as depicted in the Y-view. For clarity, gate(s) 109 are depicted as a generic gate or gate structure and may be for example, a sacrificial gate 116, a sacrificial gate structure 121, a replacement gate 134, replacement gate structure 135, depicted in FIG. 18, or the like.

For clarity, the term "same region type" or the like is defined herein to be regions of a semiconductor IC device that share the same semiconductor impurities within the transistors formed therein to form the same type of transistor (e.g., p-type regions share the same or similar trivalent impurities in the appropriate transistor structure(s) to form p-type transistors and n-type regions share the same or similar pentavalent impurities in the appropriate transistor structure(s) to form n-type transistors) but need not be in the same region location.

FIG. 1 depicts cross-sectional views of the semiconductor IC device 100 after initial fabrication operations, in accordance with embodiments of the present disclosure. In the present fabrication stage, one or more nanolayer stacks 125 are formed upon a substrate 102. Further in the present fabrication stage, shallow trench isolation (STI) region(s) 104 may be formed upon the substrate 102 next to nanolayer stacks 125. Further in the present fabrication stage, one or more sacrificial gate structures 121 are formed upon the STI regions 104 around the one or more nanolayer stacks 125.

Non-limiting examples of suitable materials for the substrate 102 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 102 can be a bulk semiconductor material that includes Si.

The nanolayer stack 125 may be formed by fabricating and alternating series of sacrificial nanolayers 106, such as SiGe sacrificial nanolayers, and active nanolayers 108. such as Si nanolayers. The sacrificial nanolayers 106 can have Ge % ranging from 20% to 45%. In an implementation, the bottom sacrificial nanolayer 106 may be epitaxially grown from the substrate 102 and the alternating active nanolayers 108 sacrificial nanolayer 106 may be formed by epitaxially growing one layer and then the next until the desired number and desired thicknesses of the layers are achieved. Any number of alternating nanolayers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a (100) orientated crystalline surface will take on a (100) orientation. In some embodiments, epitaxial growth and/or deposition processes are selective to forming on semiconductor surfaces, and generally do not deposit material on exposed surfaces, such as silicon dioxide or silicon nitride surfaces.

In some embodiments of the disclosure, the active nanolayers 108 are formed from Si and can include, for example, monocrystalline Si. The active nanolayers 108 can have a thickness of, for example, from about 4 to about 12 nm. In embodiments the sacrificial nanolayers 106 are formed from SiGe and the sacrificial nanolayers 106 can have a thickness of, for example, from about 4 to about 12 nm. The sacrificial nanolayers 106 can have Ge % ranging from 20% to 45%. A mask layer (not shown) that may be used to pattern the sacrificial nanolayers 106 and active nanolayers 108 into nanolayer stack(s) 125 may be formed upon the top nanolayer.

A sacrificial nanolayer 107 may be formed during the sacrificial nanolayers 106 and active nanolayers 108 fabrication stages. The sacrificial nanolayer 107 may be formed upon a sacrificial nanolayer 106. Subsequently, another sacrificial nanolayer 106 may be formed upon the sacrificial nanolayer 107 and the alternating nanolayers may be formed. The sacrificial nanolayer 107 may be formed by epitaxially growing a SiGe layer with high Ge %, ranging from 50% to 70%. In some embodiments, the sacrificial nanolayer 107 is formed of a material that is sufficiently different from the sacrificial nanolayers 106 and active nanolayers 108, such that the sacrificial nanolayer 107 can be selectively removed without also removing the sacrificial nanolayers 106 and active nanolayers 108, and/or vice versa. The sacrificial nanolayer 107 can have a thickness of, for example, from about 4 to about 15 nm.

The one or more nanolayer stacks 125 may be patterned by removing respective undesired portion(s) or section(s) of the sacrificial nanolayers 106, active nanolayers 108, and sacrificial nanolayer 107 while retaining respective desired portions thereof. The removal of undesired portions of the sacrificial nanolayers 106, active nanolayers 108, and sacrificial nanolayer 107 can be accomplished using, for example, lithography and etch process. The removal of such undesired portions may further remove undesired portions of substrate 102, as depicted. Desired portions of the sacrificial nanolayers 106, active nanolayers 108, and sacrificial nanolayer 107 may be protected by the mask, thereby forming the one or more nanolayer stacks 125.

In an example, first lithography and etching stage(s) may be used to remove undesired portions of the sacrificial nanolayers 106, active nanolayers 108, and sacrificial nanolayer 107 and may define a channel width 111 of bottom transistor region 105 of the nanolayer stack(s) 125 and a nanolayer stack(s) 125 length 115. Subsequently, second lithography and etching stage(s) may be used to remove further undesired portions of the sacrificial nanolayers 106, active nanolayers 108, and sacrificial nanolayer 107 within the nanolayer stack(s) 125 and may define the channel width 113 of top transistor region 103.

After nanolayer stack 125 patterning, at least one nanolayer stack 125, as depicted, includes bottom transistor region 105 and top transistor region 103. The sacrificial nanolayer 107 within the nanolayer stack 125 may vertically separate the bottom transistor region 105 from the top transistor region 103. The bottom transistor region 105 channel width 111 may be larger than the top transistor region 103 channel width 113.

Further in the present fabrication stage, STI region(s) 104 may be formed upon the substrate 102 next to nanolayer stacks 125. For example, STI region(s) 104 may be formed within the recessed substrate 102 adjacent to the one or more nanolayer stacks 125. In the embodiment depicted, a top surface of one or more STI region(s) 104 may be coplanar with a top surface of substrate 102. STI region(s) 104 may be formed by depositing STI dielectric material upon the substrate 102 and adjacent to the nanolayer stack(s) 125, followed by STI dielectric material etch back, recess, or the like. STI regions 104 may electrically isolate components or features of neighboring transistors, or the like.

Further in the present fabrication stage, one or more sacrificial gate structures 121 are formed upon and around the one or more nanolayer stacks 125 and upon STI regions 104. Sacrificial gate structure(s) 121 may include a sacrificial gate liner (not shown), a sacrificial gate 116, and a sacrificial gate cap 118.

The sacrificial gate structure 121 may be formed by forming a sacrificial gate liner layer (e.g., a dielectric, oxide, or the like) upon STI regions 104 and upon and around nanolayer stack(s) 125. The sacrificial gate structure 121 may further be formed by subsequently forming a sacrificial gate layer (e.g., amorphous silicon, or the like) upon the sacrificial gate liner layer. The thickness of the sacrificial gate layer may be greater than the height of the one or more nanolayer stack(s) 125. The sacrificial gate structure 121 may further be formed by subsequently forming a gate cap layer upon the sacrificial gate layer. The gate cap layer may be formed by depositing a mask material, such as a hard mask material, such as silicon nitride, silicon oxide, combinations thereof, or the like. The gate cap layer may be composed of one or more layers masking materials to protect the sacrificial gate layer and/or other underlying materials during subsequent processing of semiconductor IC device 100.

The sacrificial gate structure 121 may further be formed by patterning the gate cap layer, sacrificial gate layer, and sacrificial gate liner by, for example, using lithography and etch process to remove undesired portions and retain desired portion(s), respectively. The retained desired portion(s) of the gate cap layer, sacrificial gate layer, and sacrificial gate liner may form the sacrificial gate liner (not shown), the sacrificial gate 116, and the sacrificial gate cap 118, respectively, of each of the one or more sacrificial gate structures 121.

Each sacrificial gate structure 121 can be formed on targeted regions or areas of semiconductor IC device 100 to define the length of one or more GAA FETs, one or more GAA FET channels, or the like, and to provide sacrificial material for yielding targeted GAA FET structure(s) in subsequent processing. According to an example, each sacrificial gate structure 121 can have a height of between approximately 50 nm and approximately 200 nm, and a length of between approximately 10 nm and approximately 200 nm.

Figure 2:
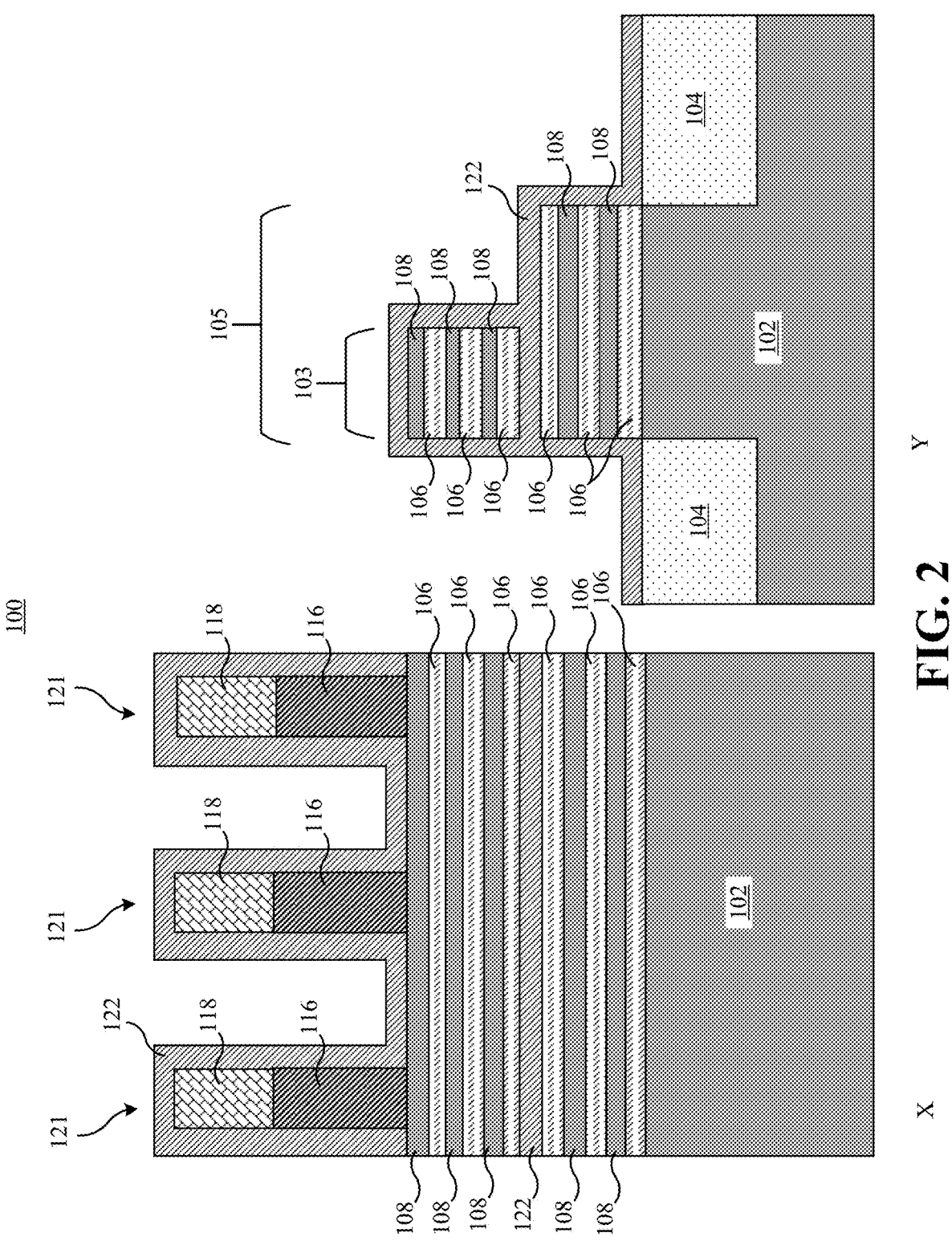

FIG. 2 depicts cross-sectional views of semiconductor IC device 100 shown after exemplary fabrication operation(s), in accordance with one or more embodiments. In the depicted fabrication stage, sacrificial nanolayer 107 may be selectively removed. Further in the depicted fabrication stage, a middle dielectric isolation (MDI) and spacer layer 122 may be formed in place of the removed sacrificial nanolayer 107. The middle dielectric isolation (MDI) and spacer layer 122 may be formed upon STI region(s) 104, may be formed upon and around one or more nanolayer stack(s) 125, and may be formed upon and around the one or more sacrificial gate structure(s) 121.

An MDI portion of the MDI and spacer layer 122 may be formed by selectively removing sacrificial nanolayer 107, thereby resultantly forming an associated MDI cavity between sacrificial nanolayers 106 within bottom transistor region 105 and top transistor region 103. In place of the removed sacrificial nanolayer 107, the MDI portion of the MDI and spacer layer 122 may be formed upon the bottom transistor region 105 of the one or more nanolayer stack(s) 125 and between bottom transistor region 105 and top transistor region 103 thereof. The MDI portion of the MDI and spacer layer 122 may have a horizontal orientation.

A spacer portion of the MDI and spacer layer 122 may be formed around each of the one or more sacrificial gate structures 121. The spacer portion of the MDI and spacer layer 122 may further be formed upon at least a portion of the sidewalls of the one or more nanolayer stack(s) 125 and upon the top surface of a portion of the STI regions 104.

The MDI portion and the spacer portion of the MDI and spacer layer 122 may be simultaneously formed by a conformal deposition of a dielectric material, such as silicon nitride, SiBCN, SiNC, SiN, SiCO, SiNOC, or a combination thereof, or the like, within the MDI cavities, upon STI regions 104, upon around the one or more sacrificial gate structures 121, and upon and around the one or more nanolayer stack(s) 125.

Figure 3:
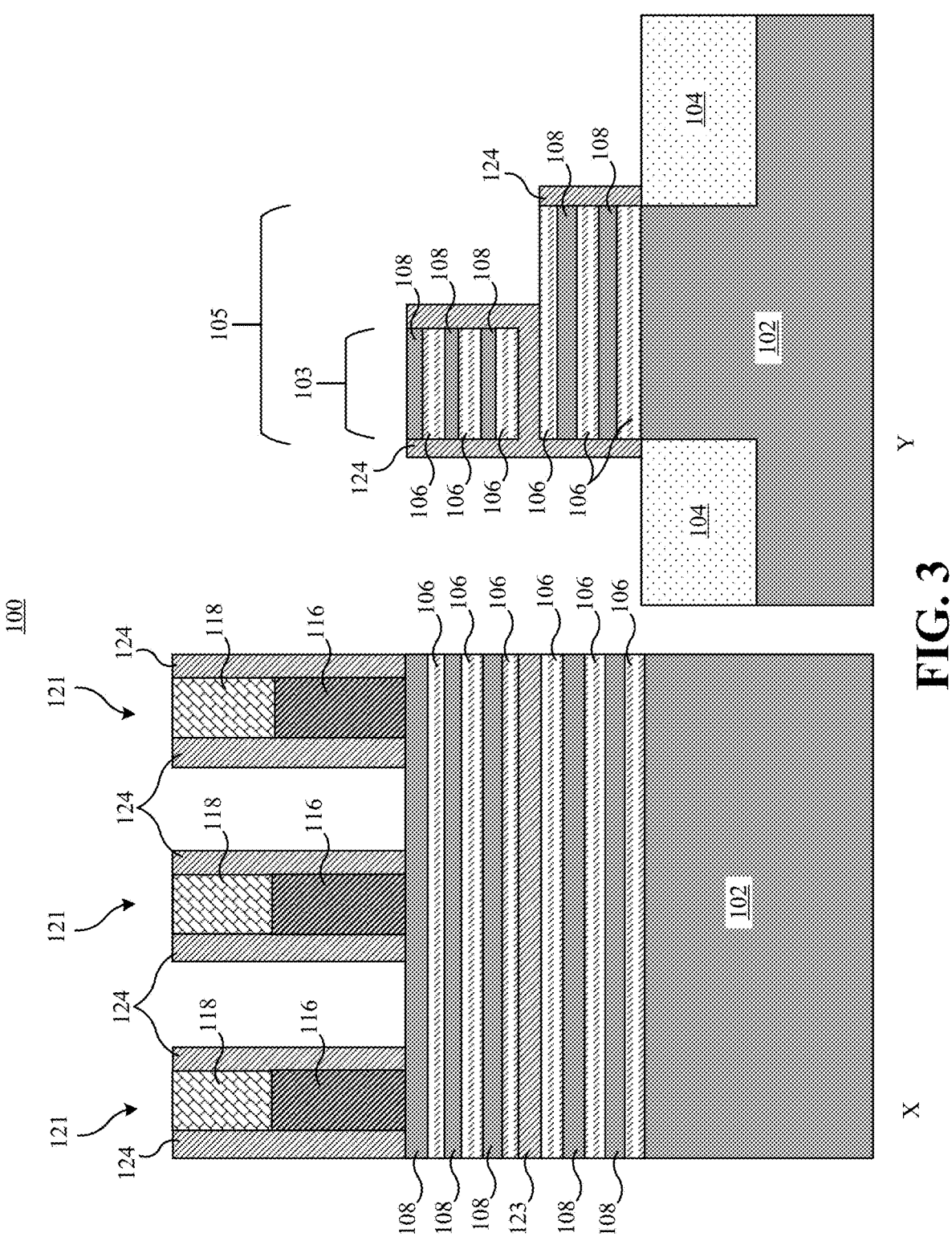

FIG. 3 depicts cross-sectional views of semiconductor IC device 100 shown after exemplary fabrication operation(s), in accordance with one or more embodiments. In the depicted fabrication stage, undesired portions of MDI and spacer layer 122 may be removed while desired portions of MDI and spacer layer 122 may be retained. Undesired portions of MDI and spacer layer 122 may be removed by a directional ion etch, which may be referred to herein as a reactive ion etch (RIE). The RIE may remove exposed horizontal portions of the MDI and spacer layer 122 and retains vertical portions of the MDI and spacer layer 122. The vertical portion(s) which remain may be referred to as spacer(s) 124 and the horizontal portion(s) which remain between bottom transistor region 105 and top transistor region 103 may be referred to as MDI 123. In this way, a spacer(s) 124 may be formed upon STI region 104 and upon and around the sidewalls of the one or more sacrificial gate structures 121. Similarly, a spacer(s) 124 may be formed upon STI region 104 and upon and around the sidewalls of the one or more nanolayer stack(s) 125. Likewise, MDI 123 may be formed between bottom transistor region 105 and top transistor region 103. The RIE may at least partially expose the topmost nanolayer within bottom transistor region 105 (e.g., sacrificial nanolayer 106) and may at least partially expose the topmost nanolayer within top transistor region 103.

Figure 4:
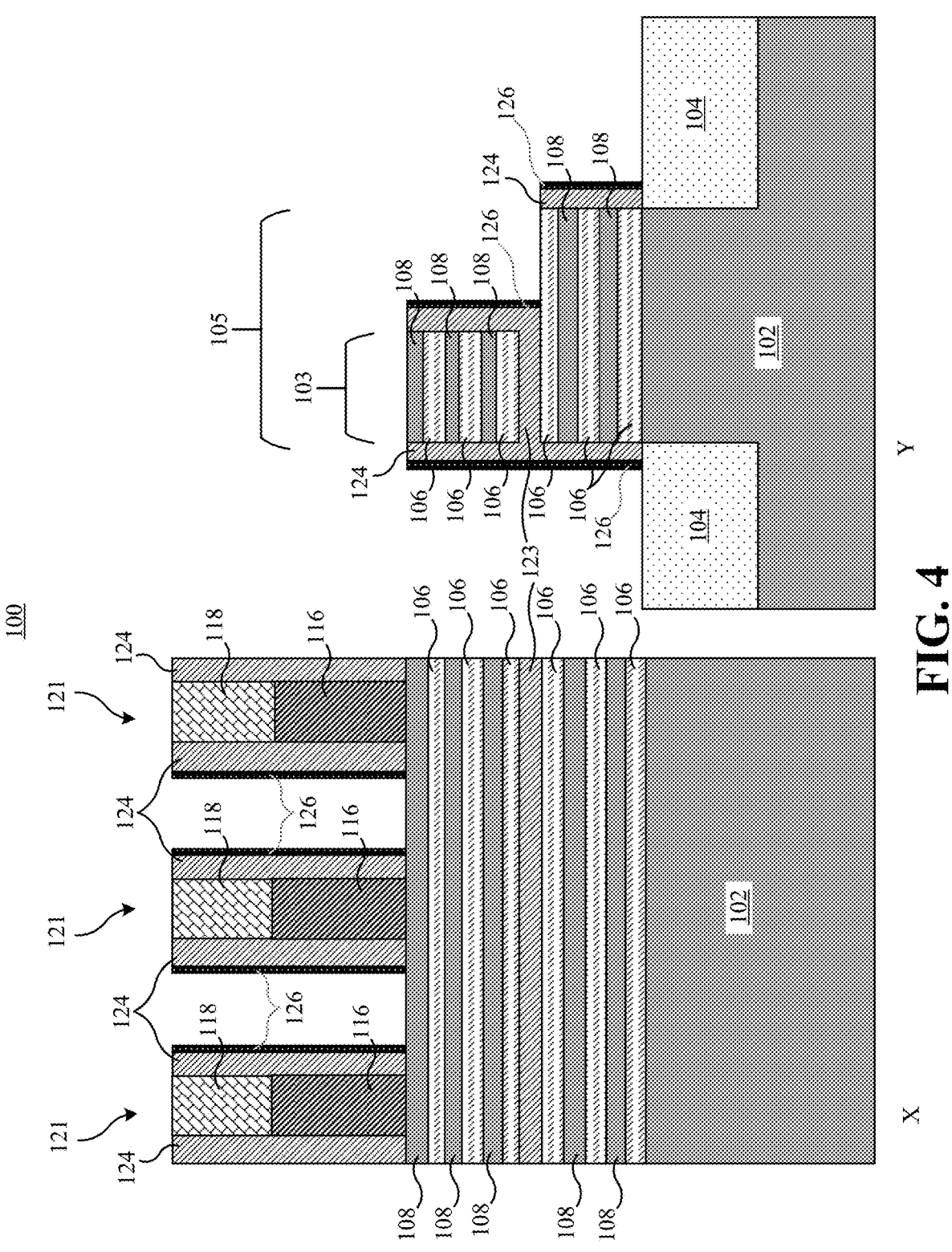

FIG. 4 depicts cross-sectional views of semiconductor IC device 100 shown after exemplary fabrication operation(s), in accordance with one or more embodiments. In the depicted fabrication stage, spacer(s) 126 may be formed upon the spacer(s) 124. As depicted in the X-view, the spacer(s) 126 may be formed by a selective deposition (e.g., deposition on vertical surfaces) of a dielectric, such as an oxide, upon the STI region(s) 104 and upon spacer(s) 124 generally associated with sidewalls of the one or more sacrificial gate structures 121. Similarly, as depicted in the Y-view, a spacer(s) 126 may be formed by selective deposition of the dielectric upon the STI region(s) 104 and upon spacer(s) 124 generally associated with sidewalls of the one or more nanolayer stack(s) 125. Alternatively, spacer(s) 126 may be formed by depositing a blanket dielectric layer upon the semiconductor IC device 100 of FIG. 4 and performing a RIE to remove horizontal portions of the blanket dielectric layer while retaining vertical portions of the blanket dielectric layer.

Figure 5:
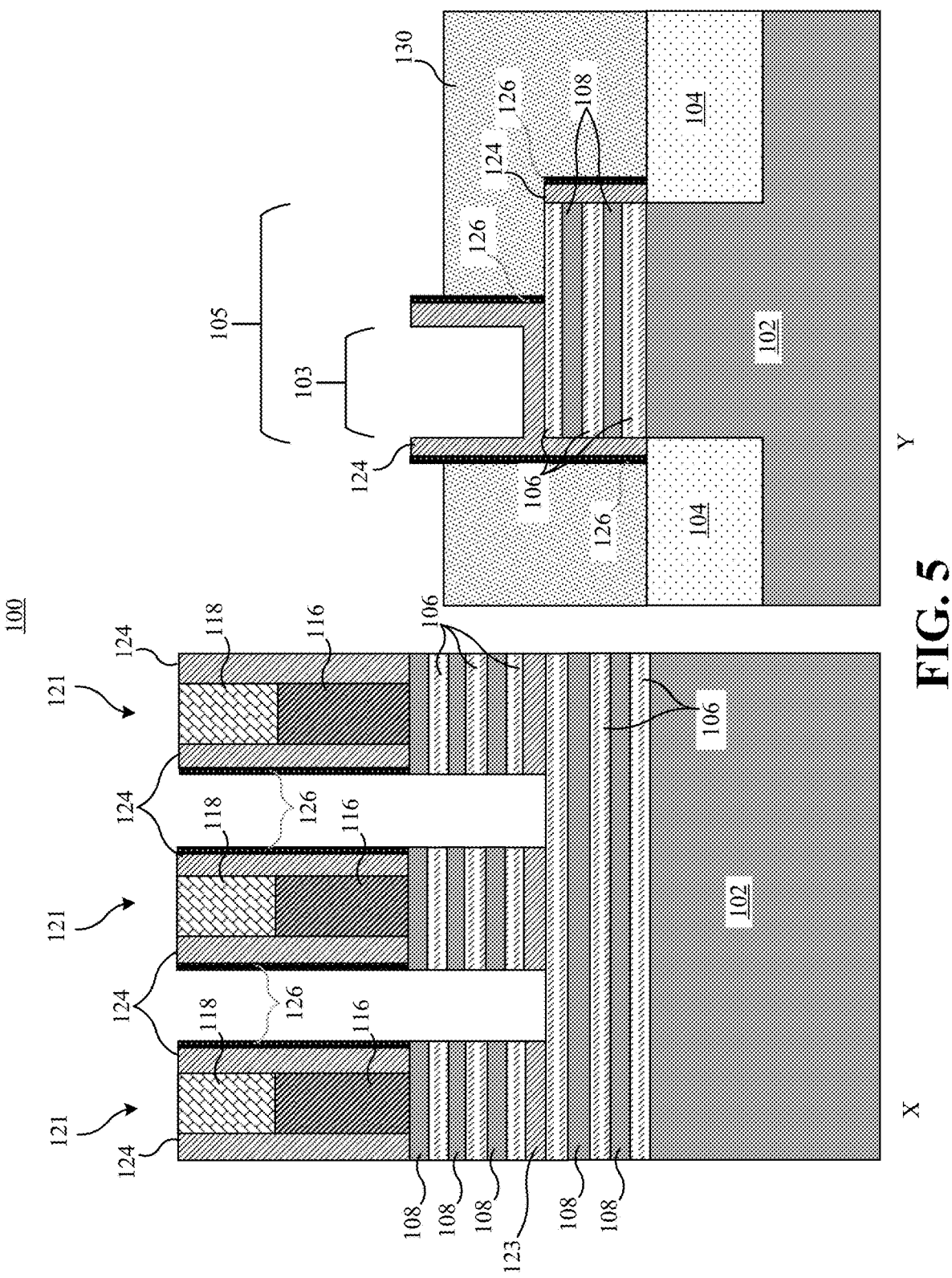

FIG. 5 depicts cross-sectional views of semiconductor IC device 100 shown after exemplary fabrication operation(s), in accordance with one or more embodiments. In the depicted fabrication stage, one or more source/drain (S/D) recesses 160 are formed. The one or more S/D recesses 160 may be formed between sacrificial gate structures 121, as depicted in the X-view, by removing sacrificial nanolayer(s) 106 and by removing active nanolayer(s) 108 that are between spacer(s) 124 and MDI 123 within top transistor region 103, as depicted in the Y-view. The one or more S/D recesses 160 may be formed to a depth stopping at the MDI 123.

Undesired sacrificial nanolayer(s) 106 and active nano-layer(s) 108 within top transistor region 103 may be removed by etching or other subtractive material removal process. Prior to removing sacrificial nanolayer(s) 106 and active nanolayer(s) 108, a mask 130 may be formed upon STI region(s) 104, upon spacer(s) 126, upon spacer(s) 124 associated with bottom transistor region 105, and upon the topmost nanolayer within bottom transistor region 105. The mask 130 may be an organic planarization layer (OPL), or other mask material that can generally protect the underlying regions of semiconductor IC device 100 while the sacrificial nanolayer(s) 106 and active nanolayer(s) 108 within top transistor region 103 are removed. The mask 130 may be deposited to a thickness greater than the dimension from the STI region(s) 104 to the top of the one or more nanolayer stacks 125. After depositing the mask 130, the mask 130 may be recessed to expose at least a portion of the topmost nanolayer within top transistor region 103.

Figure 6:
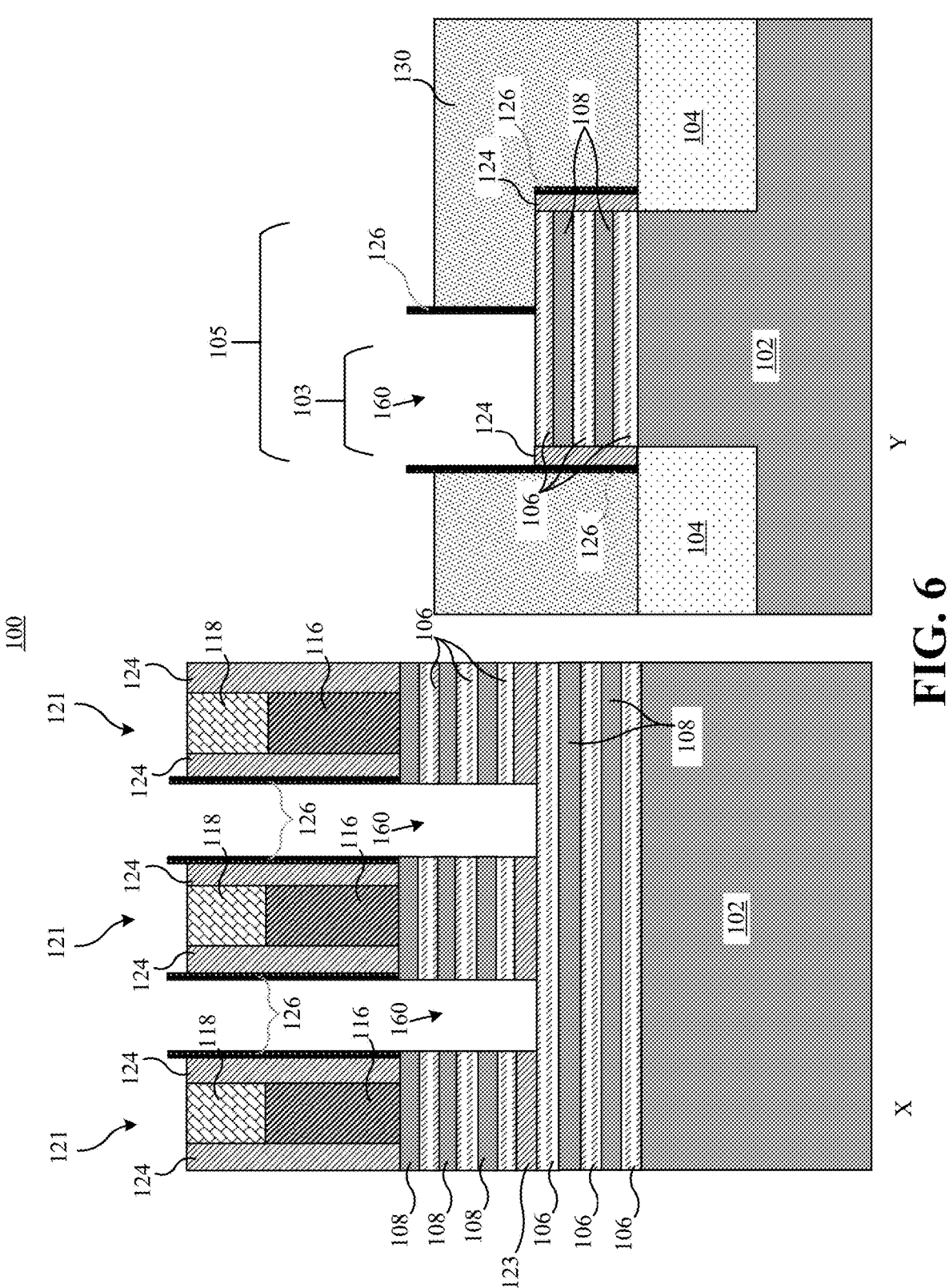

FIG. 6 depicts cross-sectional views of semiconductor IC device 100 shown after exemplary fabrication operation(s), in accordance with one or more embodiments. In the depicted fabrication stage, the spacer(s) 124 and the MDI 123 between spacer(s) 126 and above bottom transistor region 105 are removed. In other words, at the present fabrication stage, at least a portion of the top nanolayer within bottom transistor region 105 is exposed. The spacer(s) 124 and MDI 123 between spacer(s) 126 above bottom transistor region 105 may be removed by etching or other subtractive removal technique. For example, an iso-tropic etch may remove the(s) 124 and MDI 123 between spacer(s) 126 above bottom transistor region 105. As the material(s) of spacer(s) 124, MDI 123, and the nanolayers within bottom transistor region 105 may be adequately different from that of spacer(s) 126, thus having etch selec-tivity therewith, the spacer(s) 126 above the bottom transis-tor region 105 may be retained and the etch may utilize the top surface of the topmost nanolayer within bottom transis-tor region 105 as an etch stop.

Figure 7:
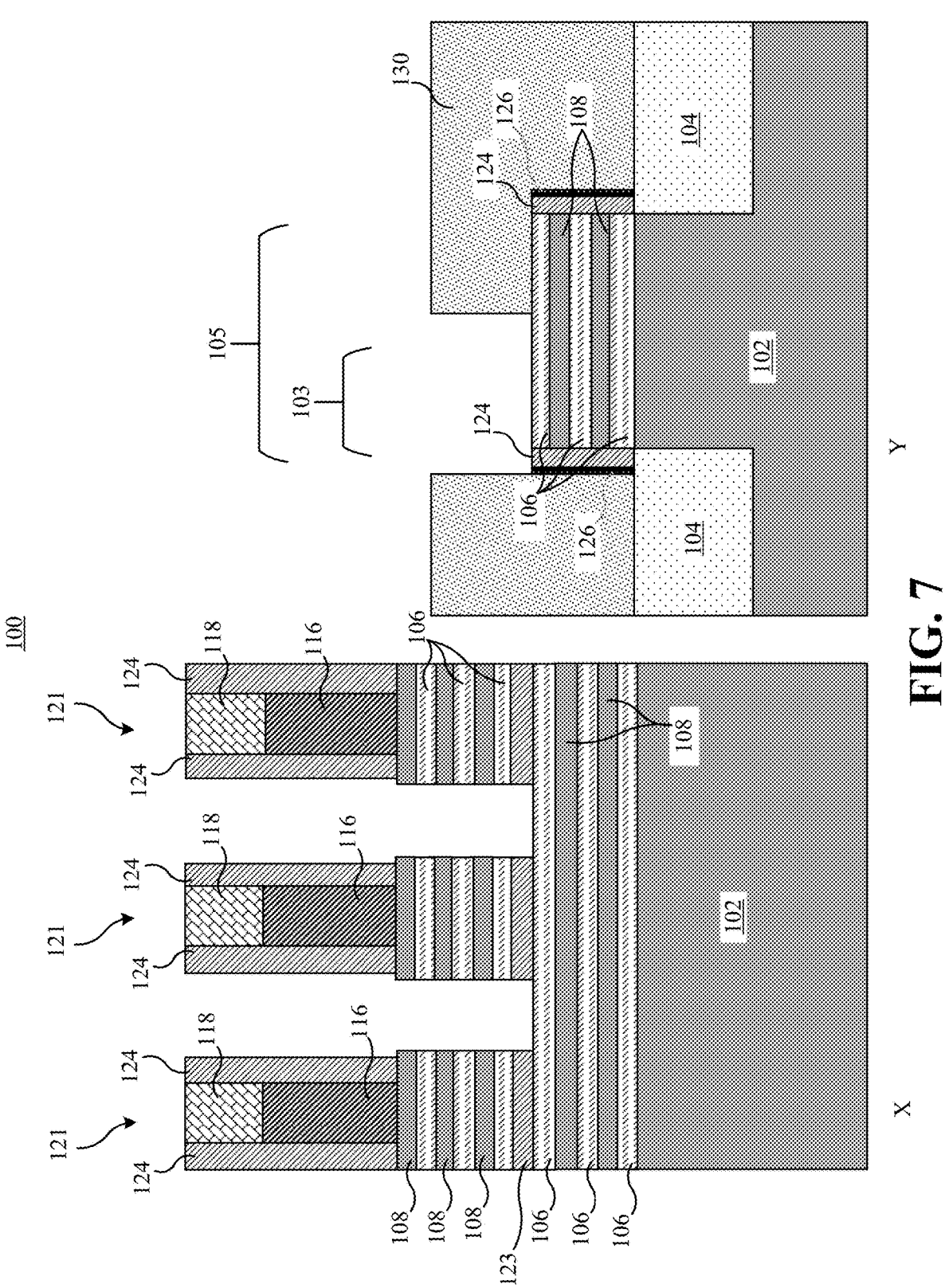

FIG. 7 depicts cross-sectional views of semiconductor IC device 100 shown after exemplary fabrication operation(s), in accordance with one or more embodiments. In the depicted fabrication stage, exposed portions of the spacer(s) 126 are removed. For example, the spacer(s) 126 that are upon the spacer(s) 124 may be removed and exposed portions of the spacer(s) 126 that are not protected by mask 130 may be removed. The desired portions of the spacer(s) 126 may be removed by etching or other subtractive removal techniques. For example, an isotropic etch may remove exposed portions of the spacer(s) 126 that are above bottom transistor region 105. As the material(s) of spacer(s) 126 and the nanolayers within bottom transistor region 105 may be adequately different, thus having etch selectivity therewith, the spacer(s) 126 above the bottom transistor region 105 may be removed and the etch may utilize the top surface of the topmost nanolayer within bottom transistor region 105 as an etch stop.

Figure 8:
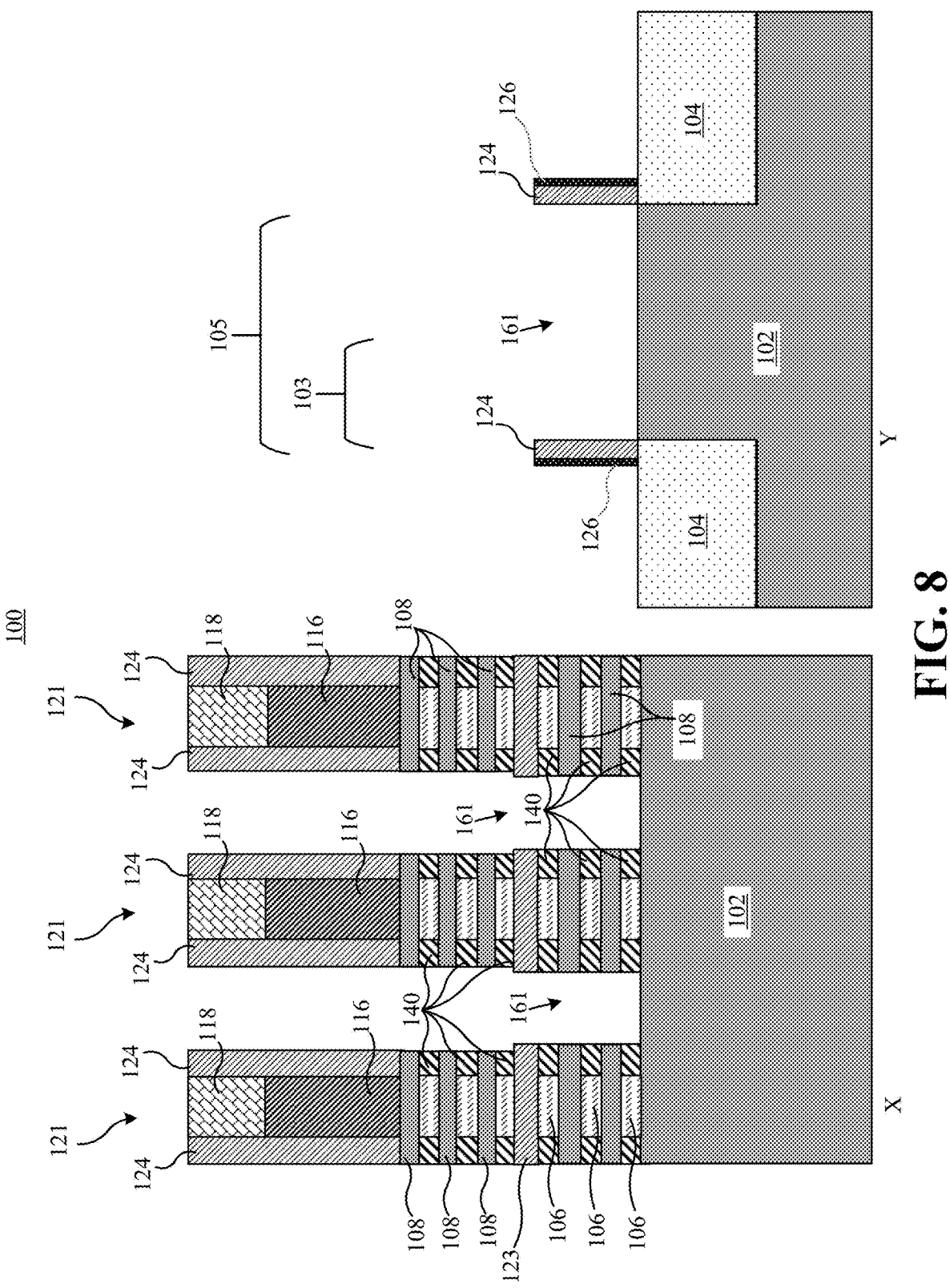

FIG. 8 depicts cross-sectional views of semiconductor IC device 100 shown after exemplary fabrication operation(s), in accordance with one or more embodiments. In the depicted fabrication stage, the mask 130 is removed and one or more bottom source/drain (S/D) recesses 161 are formed.

Initially at the present fabrication stage, the mask 130 may be removed by subtractive removal techniques such as etching, OPL ashing, or the like. Specifically, the mask 130 material upon the STI region(s) 104 and upon the bottom transistor region 105 may be removed and may effectively expose the nanolayers within bottom transistor region 105.

The one or more bottom S/D recesses 161 may be formed between sacrificial gate structures 121 by removing sacrifi-cial nanolayer(s) 106 and by removing active nanolayer(s) 108 that are between spacer(s) 124 within bottom transistor region 105. The one or more S/D recesses 161 may be formed to a depth stopping at the substrate 102. The one or more bottom S/D recesses 161 may be formed by removing undesired portions of the nanolayers within bottom transistor region 105 or the portions of the nanolayers that are that are not protected by sacrificial gate structure 121 and/or by spacer(s) 124. These undesired portions of the nanolayers may be removed by etching or other subtractive removal techniques. The top surface STI region(s) 104 may be used as an etch stop. The retained one or more portions of one or more nanolayer stacks 125 may be such portions thereof that were protected generally below the sacrificial gate structure 121 and/or by the spacer(s) 124.

The semiconductor IC device 100 may be subsequently subjected to a directional reactive ion etch (RIE) process, which can remove portions of the sacrificial nanolayers 106 that are not covered by the sacrificial gate 116 and/or that are under the spacer(s) 124. The RIE can use a boron-based chemistry or a chlorine-based chemistry, for example, which selectively recesses the exposed portions sacrificial nanolayers 106 (e.g., those portions of sacrificial nanolayers 106 generally below spacer(s) 124, etc.) without significantly removing the active semiconductor nanolayers 108.

Subsequently, inner spacers 140 may be deposited in the recesses that were previously formed into the sacrificial nanolayers 106. In certain embodiments, after the formation of the inner spacers 140, an isotropic etch process is performed to create outer vertical edges to the inner spacers 140 that align with outer vertical edges of the active semiconductor nanolayers 108. In certain embodiments, the material of the inner spacer 140 is a dielectric material such as SiN, SiO, SiBCN, SiOCN, SiCO, etc.

Figure 9:
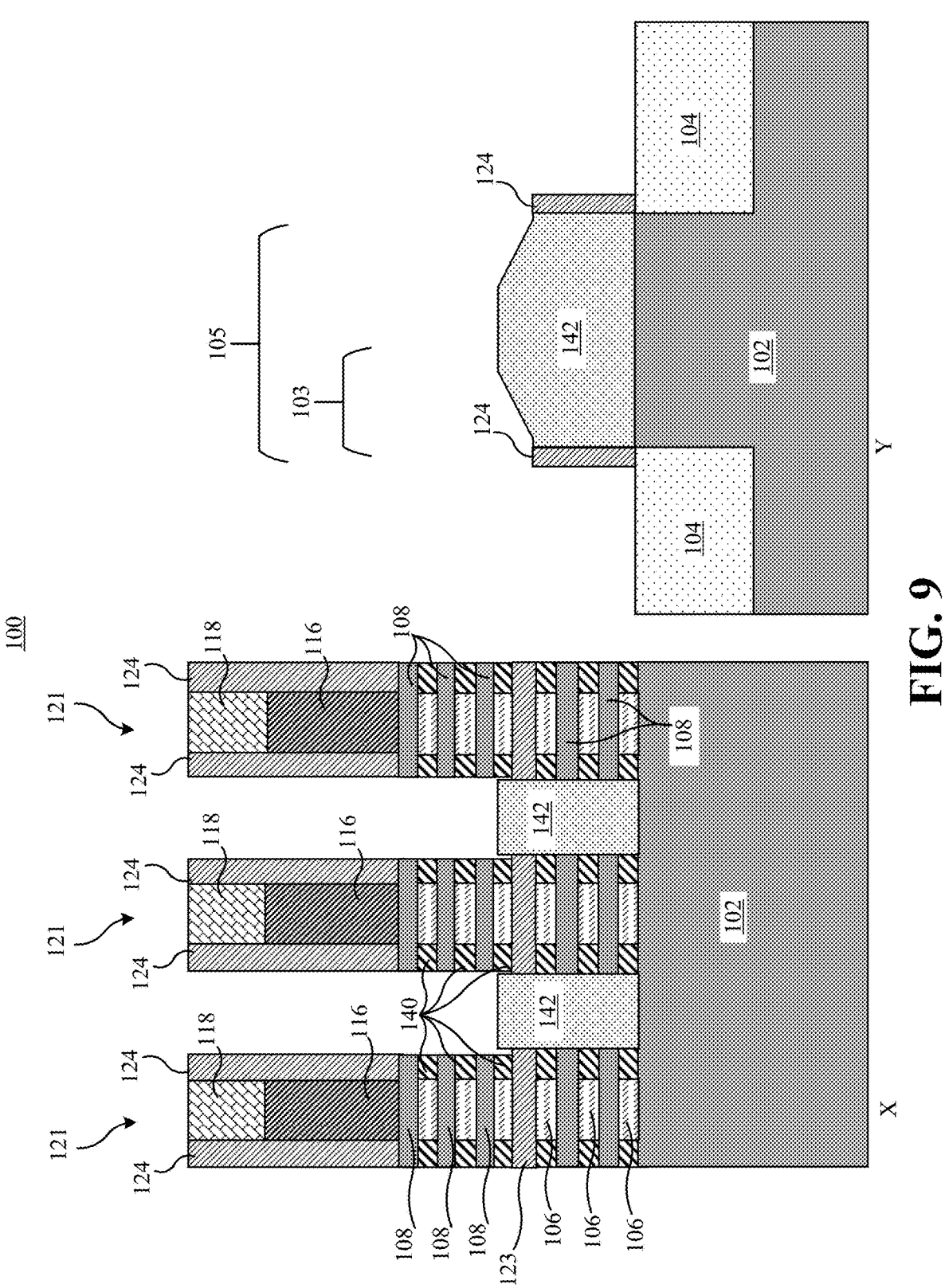

FIG. 9 depicts cross-sectional views of semiconductor IC device 100 shown after exemplary fabrication operation(s), in accordance with one or more embodiments. In the depicted fabrication stage, one or more bottom source/drain (S/D) regions 142 are formed. As depicted in the X-view, the bottom S/D region(s) 142 may be formed upon substrate 102 and in between and in contact with active semiconductor nanolayers 108 and associated inner spacers 140. As depicted in the Y-view, the bottom S/D region(s) 142 may be formed upon substrate 102 and in between and in contact with the spacers 124. The S/D region(s) 142 may be formed to a thickness initially above the top surface of MDI 123 or generally initially above the bottom transistor region 105. The bottom S/D region(s) 142 may be generally the source and/or drain for bottom device or transistor within the bottom transistor region 103.

The bottom S/D region(s) 142 may be formed by epitaxially growing a source/drain epitaxial material from exposed surface(s). In some embodiments, the bottom S/D region 142 is formed by in-situ doped epitaxial growth. In some embodiments, epitaxial growth and/or deposition processes may be selective to forming on semiconductor surfaces, and may not deposit material on dielectric surfaces, such as silicon dioxide or silicon nitride surfaces. In some embodiments, the bottom S/D region(s) 142 epitaxial growth may overgrow above the upper surface of MDI 123.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in S/D region 240 can be in the range of $1 \times 10^{19}$ cm$^{-3}$ to $2 \times 10^{21}$ cm$^{-3}$, or preferably between $2 \times 10^{20}$ cm$^{-3}$ to $7 \times 10^{20}$ cm$^{-3}$.

Figure 10:
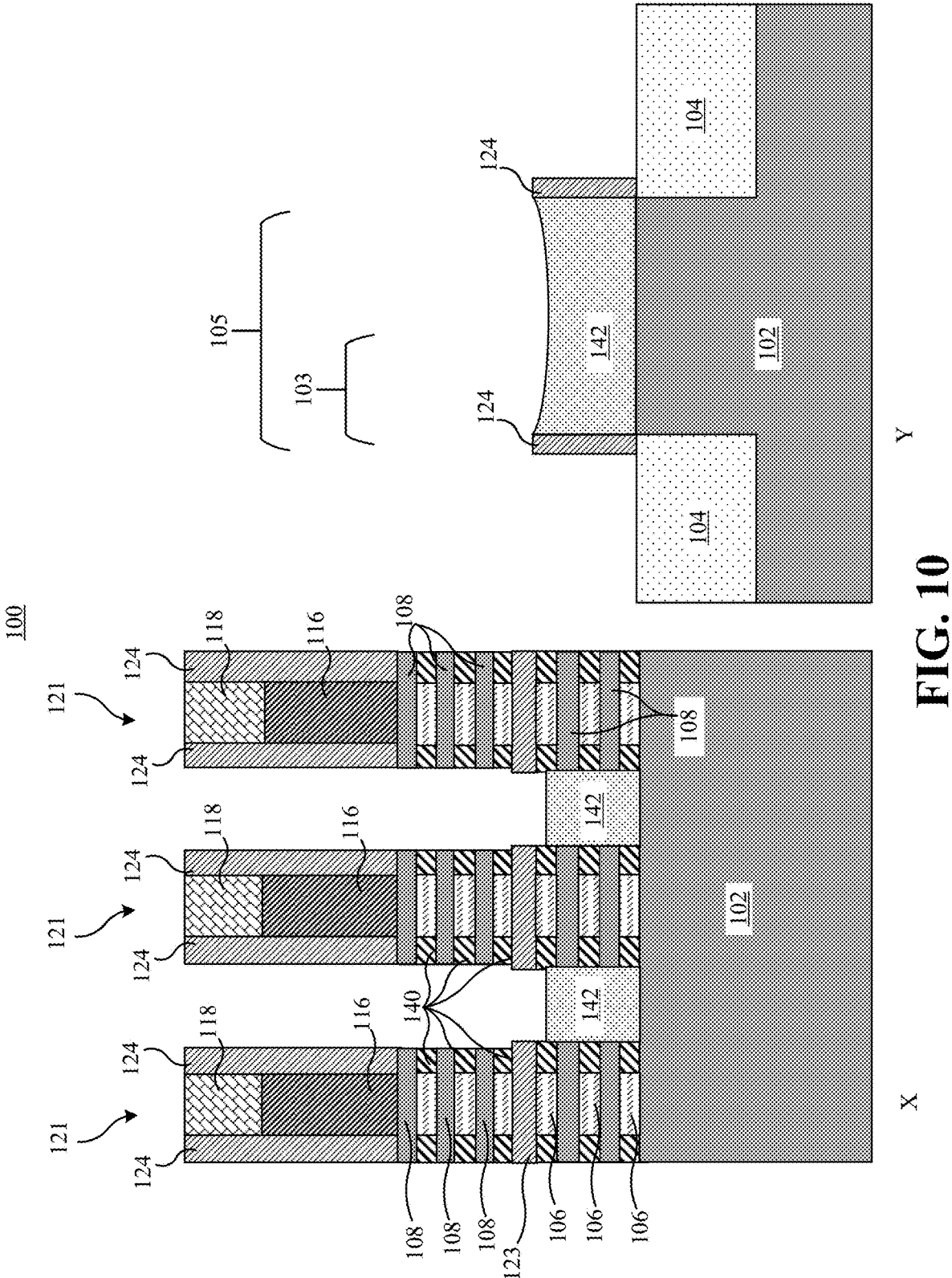

FIG. 10 depicts cross-sectional views of semiconductor IC device 100 shown after exemplary fabrication operation(s), in accordance with one or more embodiments. In the depicted fabrication stage, the one or more bottom source/drain (S/D) regions 142 are partially recessed. For example, the bottom S/D region(s) 142 may be partially recessed by a subtractive removal technique, such as an etch. The bottom S/D region(s) 142 may be recessed such that an upper portion of the bottom S/D region(s) 142 are removed while retaining a respective bottom S/D region 142 within the associated bottom transistor region 105. For example, the upper portion of the one or more S/D regions 240 may be etched or otherwise removed. The etch may be timed or otherwise controlled to stop the removal of the bottom S/D region(s) 142 such that the top surface of the remaining bottom S/D region(s) 240 is between the MDI 123 and the topmost active semiconductor nanolayer 108 that is within the bottom transistor region 105.

Figure 11:
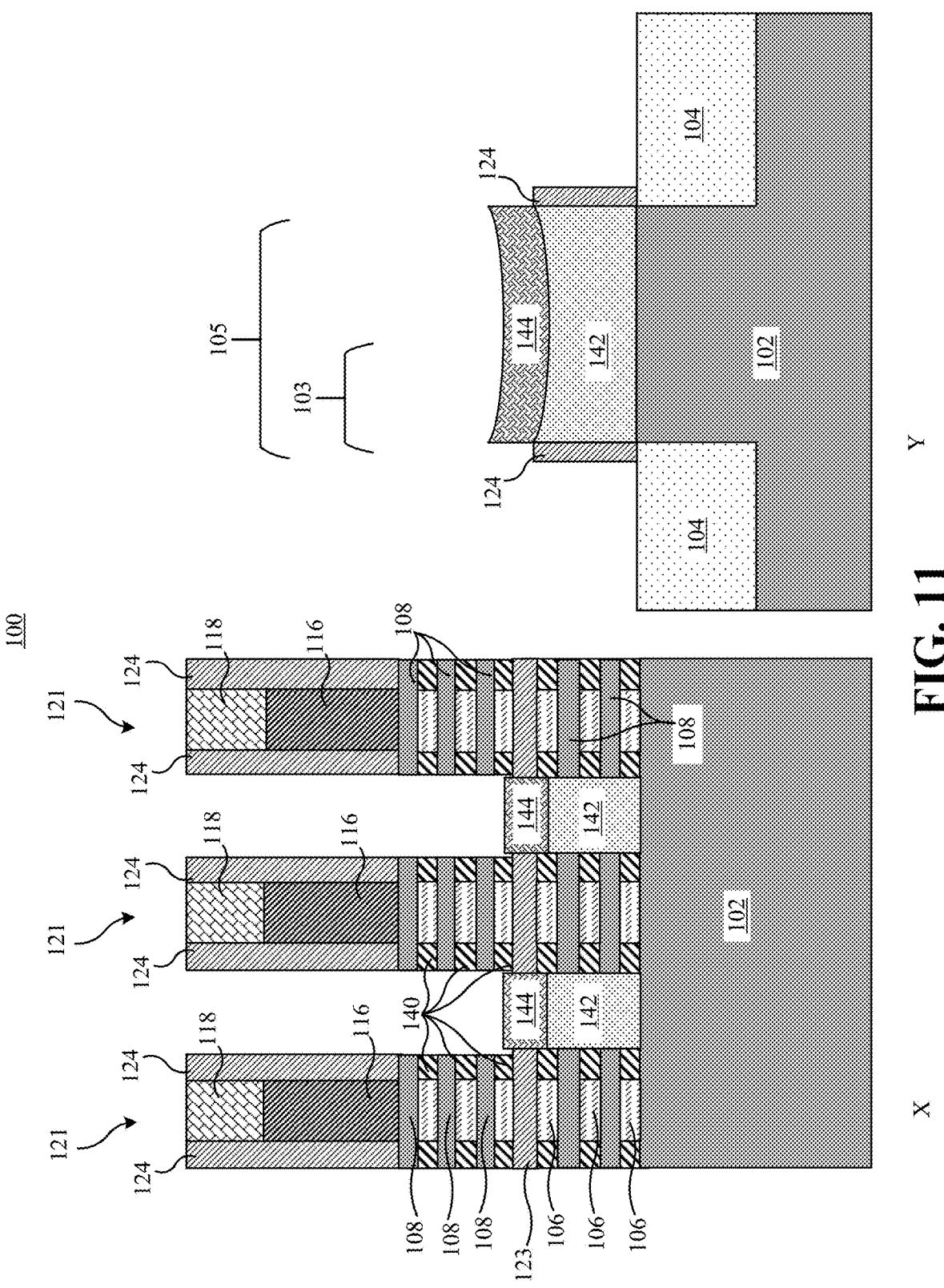

FIG. 11 depicts cross-sectional views of semiconductor IC device 100 shown after exemplary fabrication operation(s), in accordance with one or more embodiments. In the depicted fabrication stage, a sacrificial S/D region 144 is formed upon a respective bottom S/D region 142.

As depicted in the X-view, the sacrificial S/D region(s) 144 may be formed upon the respective bottom S/D region 142 and in between and in contact with active semiconductor MDI(s) 122 and associated inner spacers 140. As depicted in the Y-view, the sacrificial S/D region(s) 144 may be formed upon the respective bottom S/D region 142 and above and/or in between the spacers 124. The sacrificial S/D region(s) 144 may be formed to a thickness between the top surface of MDI 123 and a bottom surface of the bottom most active semiconductor nanolayer within upper transistor region 103.

The sacrificial S/D region(s) 144 may be formed by epitaxially growing sacrificial S/D epitaxial material from the underlying associated bottom S/D region(s) 142. In some embodiments, epitaxial growth and/or deposition processes may be selective to forming on semiconductor surfaces, and may not deposit material on dielectric surfaces, such as silicon dioxide or silicon nitride surfaces. For example, sacrificial S/D region(s) 144 may be formed by epitaxially growing a SiGe layer with high Ge %, ranging from 50% to 70%. In some embodiments, the sacrificial S/D region(s) 144 is formed of a material that is sufficiently different from the bottom S/D region(s) 142 and top S/D regions 146, exemplary depicted in FIG. 12, such that the sacrificial S/D region(s) 144 can be selectively removed without also removing the bottom S/D region(s) 142 and top S/D regions 146.

Figure 12:
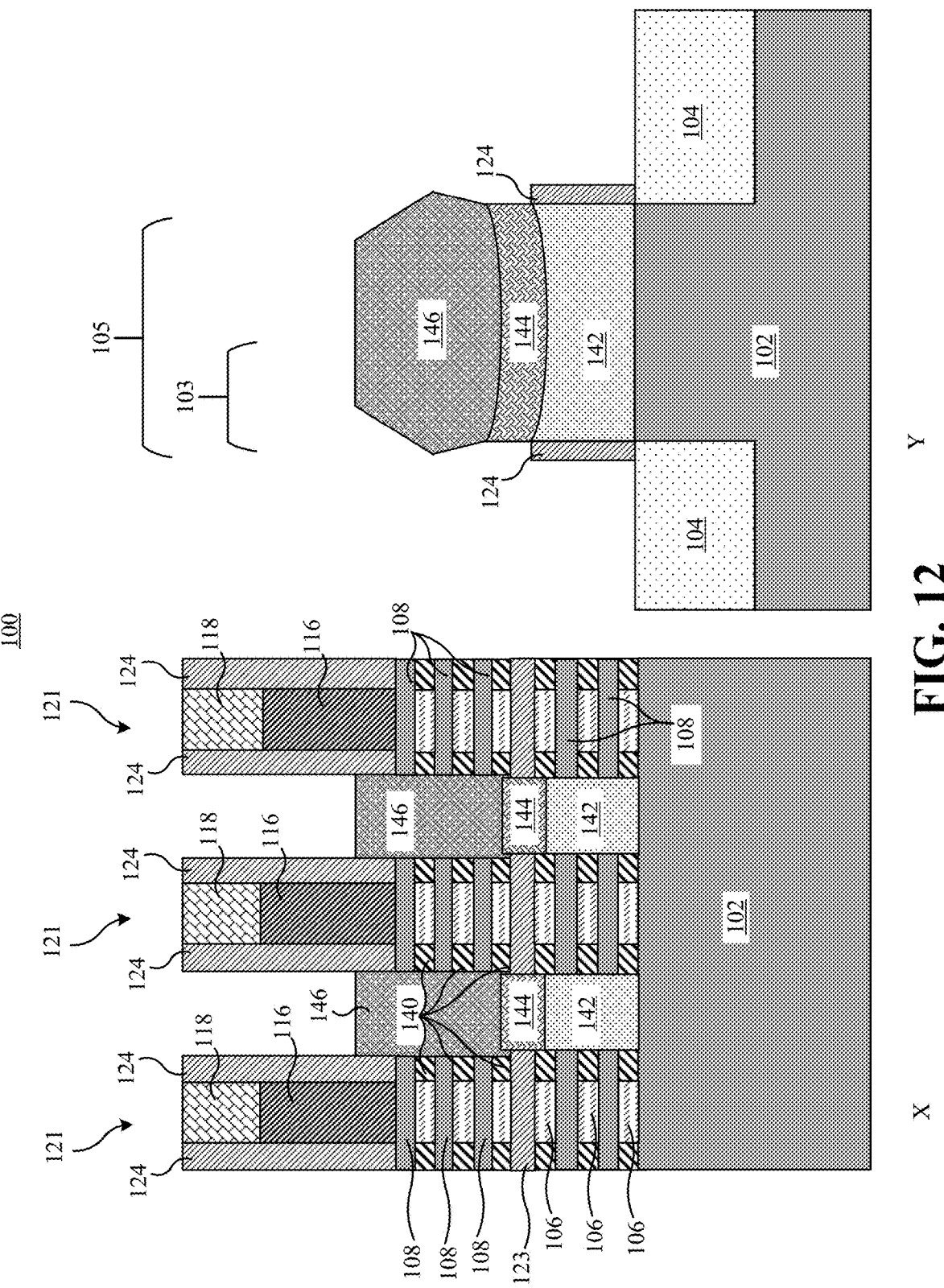

FIG. 12 depicts cross-sectional views of semiconductor IC device 100 shown after exemplary fabrication operation(s), in accordance with one or more embodiments. In the depicted fabrication stage, a top S/D region 146 is formed upon a respective sacrificial S/D region 142. As depicted in the X-view, the top S/D region(s) 142 may be formed upon respective sacrificial S/D region 142 and in between and in contact with active semiconductor nanolayers 108, in contact with inner spacers 140, and in one or more spacer(s) 124. The top S/D region(s) 146 may be formed to a thickness above the top surface of the topmost active semiconductor nanolayer 108 within the top transistor region 105. The top S/D region(s) 146 may be generally the source and/or drain for the top device or transistor within the top transistor region 105.

The top S/D region(s) 146 may be formed by epitaxially growing a source/drain epitaxial material from exposed surface(s) of the underlying respective sacrificial S/D region 142. In some embodiments, the top S/D region 146 is formed by in-situ doped epitaxial growth. In some embodiments, epitaxial growth and/or deposition processes may be selective to forming on semiconductor surfaces, and may not deposit material on dielectric surfaces, such as silicon dioxide or silicon nitride surfaces. In some embodiments, the top S/D region(s) 146 epitaxial growth may overgrow above the upper surface of the top surface of the topmost active semiconductor nanolayer 108 within top transistor region 105.

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments, the S/D epitaxial growth conditions that promote in-situ Boron doped SiGe for p-type transistor and phosphorus or arsenic doped silicon or Si:C for n-type transistors. The doping concentration in S/D region 240 can be in the range of $1 \times 10^{19}$ cm$^{-3}$ to $2 \times 10^{21}$ cm$^{-3}$, or preferably between $2 \times 10^{20}$ cm$^{-3}$ to $7 \times 10^{20}$ cm$^{-3}$.

Figure 13:
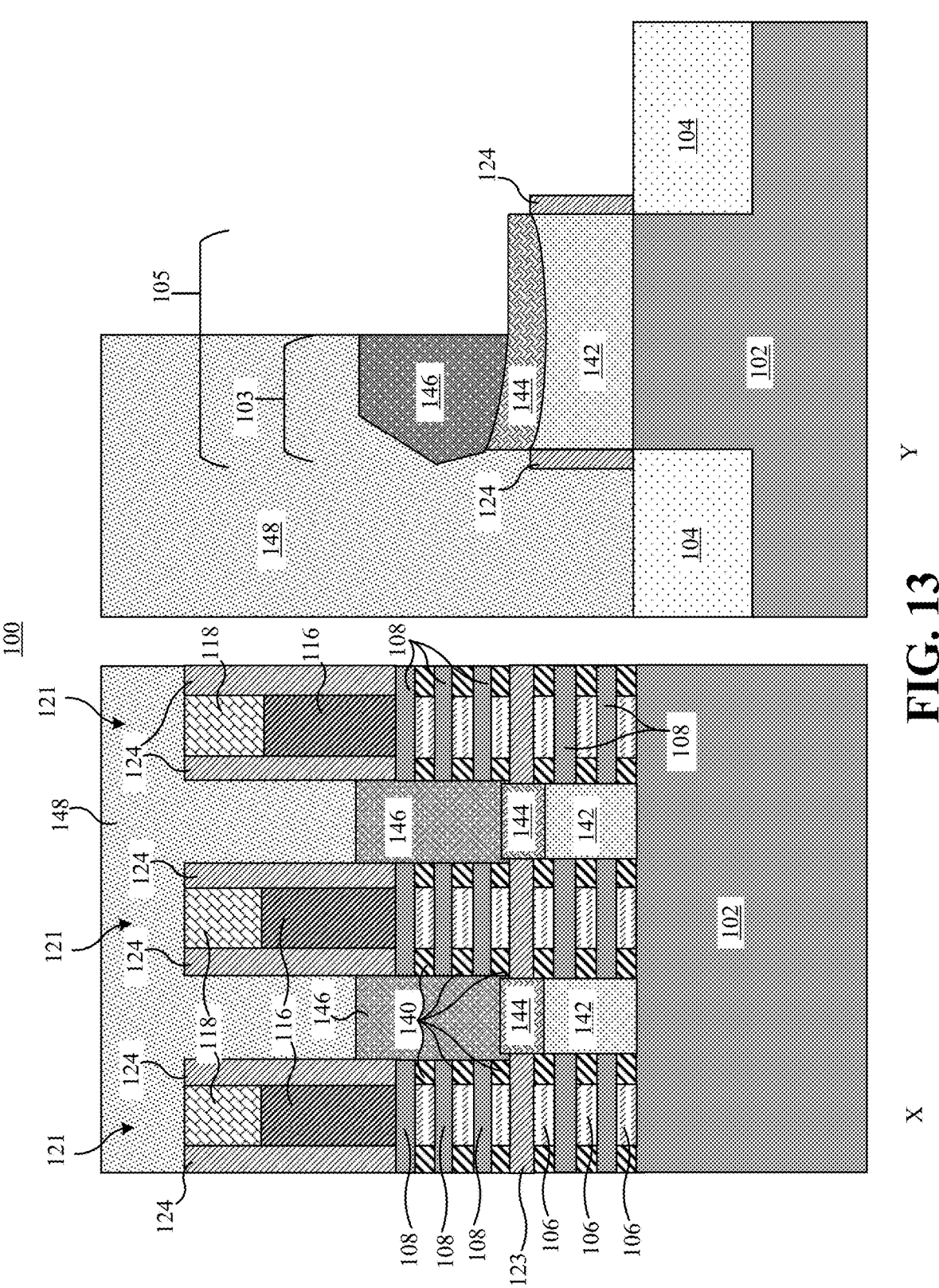

FIG. 13 depicts cross-sectional views of semiconductor IC device 100 shown after exemplary fabrication operation(s), in accordance with one or more embodiments. In the depicted fabrication stage, the one or more top S/D regions 146 are partially recessed and a portion of the sacrificial S/D region(s) 144 that is not within the top transistor region 103 is exposed.

The one or more top S/D regions 146 may be partially recessed and the portion of the sacrificial S/D region(s) 144 that is not within the top transistor region 103 may be exposed by initially applying a mask 148 upon STI region(s) 104 upon spacer(s) 124, upon sacrificial S/D region(s) 144, upon top S/D region(s) 146, upon sacrificial gate cap 118, and/or the like. The mask 148 may be a dielectric material, OPL material, mask material, or the like, and may be formed by depositing a blanket mask material. A portion of the mask 148 that is not within the top transistor region 103 may be removed, thereby exposing respective portions of STI region(s) 104, spacer(s) 124, sacrificial S/D region(s) 144, top S/D region(s) 146, and/or the like that are not within the top transistor region 103. In other words, undesired portion(s) of the mask 148 are removed while desired portion(s) of the mask 148 are retained and may generally cover and protect the underlying top transistor region 103.

The exposed portion(s) of the top S/D region(s) 146 that are not covered or protected by mask 148 may be removed by a subtractive removal technique, such as an etch. The top S/D region(s) 146 may be recessed or processed such that portion(s) of the top S/D region(s) 146 within the top transistor region 103 are retained while portion(s) of the top S/D region(s) 146 that are not within the top transistor region 103 are removed. The etch may be timed or otherwise controlled to stop the removal of the top S/D region(s) 146 with respect to the material of the underlying sacrificial S/D region(s) 144 so as to generally expose the portion(s) of the sacrificial S/D region(s) 144 that are not within the top transistor region 103.

Due to the etch or removal of the portion(s) of the top S/D region(s) 146, the top S/D region(s) 146 may include an etched side surface (i.e., right side surface of the Y-view) that has a geometry and material properties generally associated with a etch (e.g., straight, slanted, vertical, etc.) and material properties generally associated with an etch (e.g., an etched surface, etc.). Further, the top S/D region(s) 146 may include a cryptographic side surface (i.e., left side surface of the Y-view) that has a geometry and material properties generally associated with epitaxial growth (crystallographic plane surface, etc.).

Figure 14:
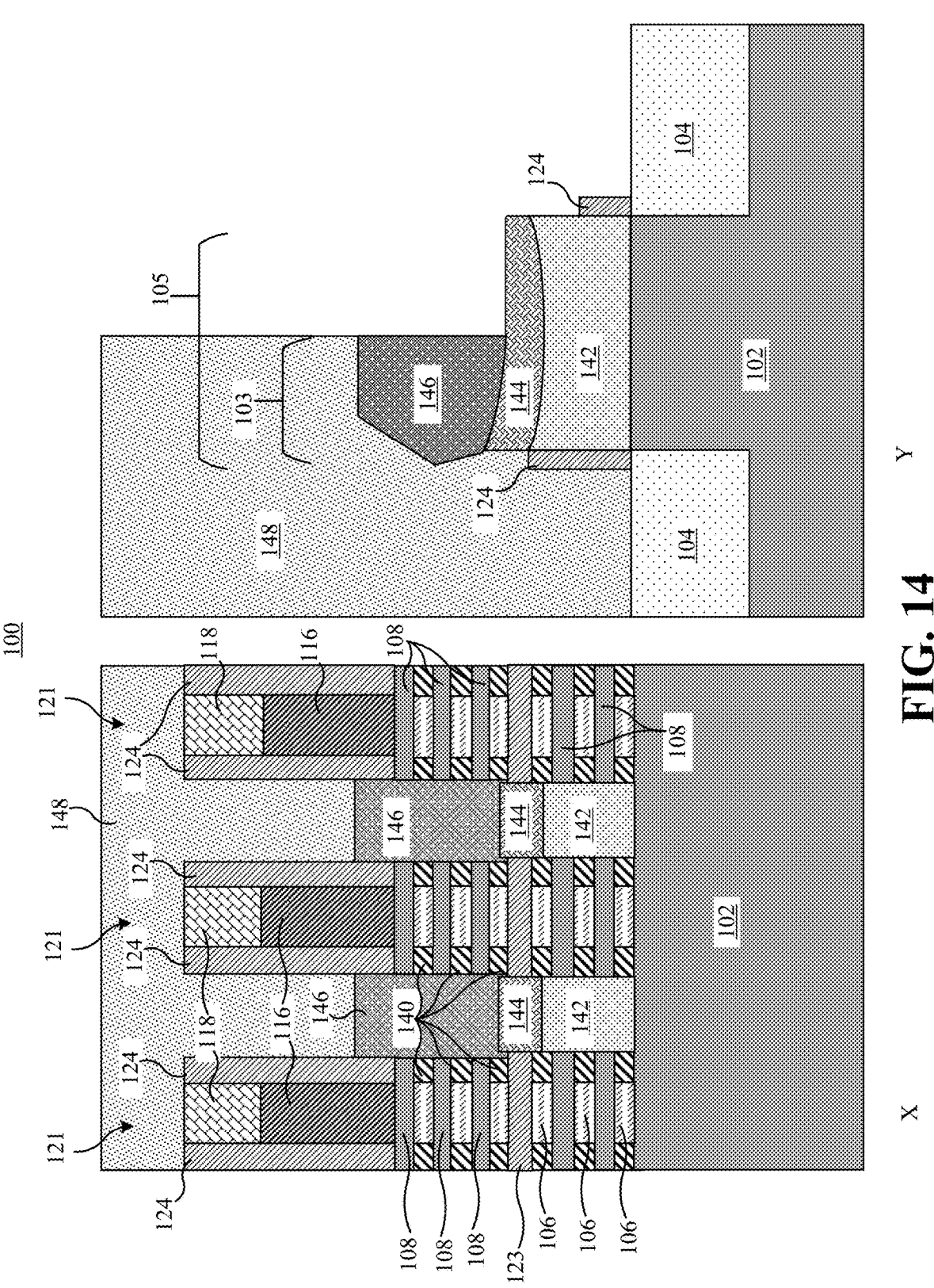

FIG. 14 depicts cross-sectional views of semiconductor IC device 100 shown after exemplary fabrication operation(s), in accordance with one or more embodiments. In the depicted fabrication stage, the exposed spacer(s) 124 that are not within the top transistor region 103 may be partially recessed and a portion of a sidewall of bottom S/D region 142 may be removed. The exposed spacer(s) 124 that are not within the top transistor region 103 may be partially recessed and the portion of a sidewall of bottom S/D region 142 may be exposed by performing an etch process, or another subtractive removal technique, that removes a top portion while retaining a bottom portion of such exposed spacer(s) 124. This removal of respective top portion(s) of such exposed spacer(s) 124 generally exposes the portion of a sidewall of bottom S/D region 142. The etch may be timed or otherwise controlled to stop the removal of exposed spacer(s) 124 such that the top surface of the remaining exposed spacer(s) 124 is between a top surface and bottom surface of bottom S/D region 142. For clarity, in some examples, the fabrication operation(s) of this depicted fabrication stage may be omitted.

Figure 15:
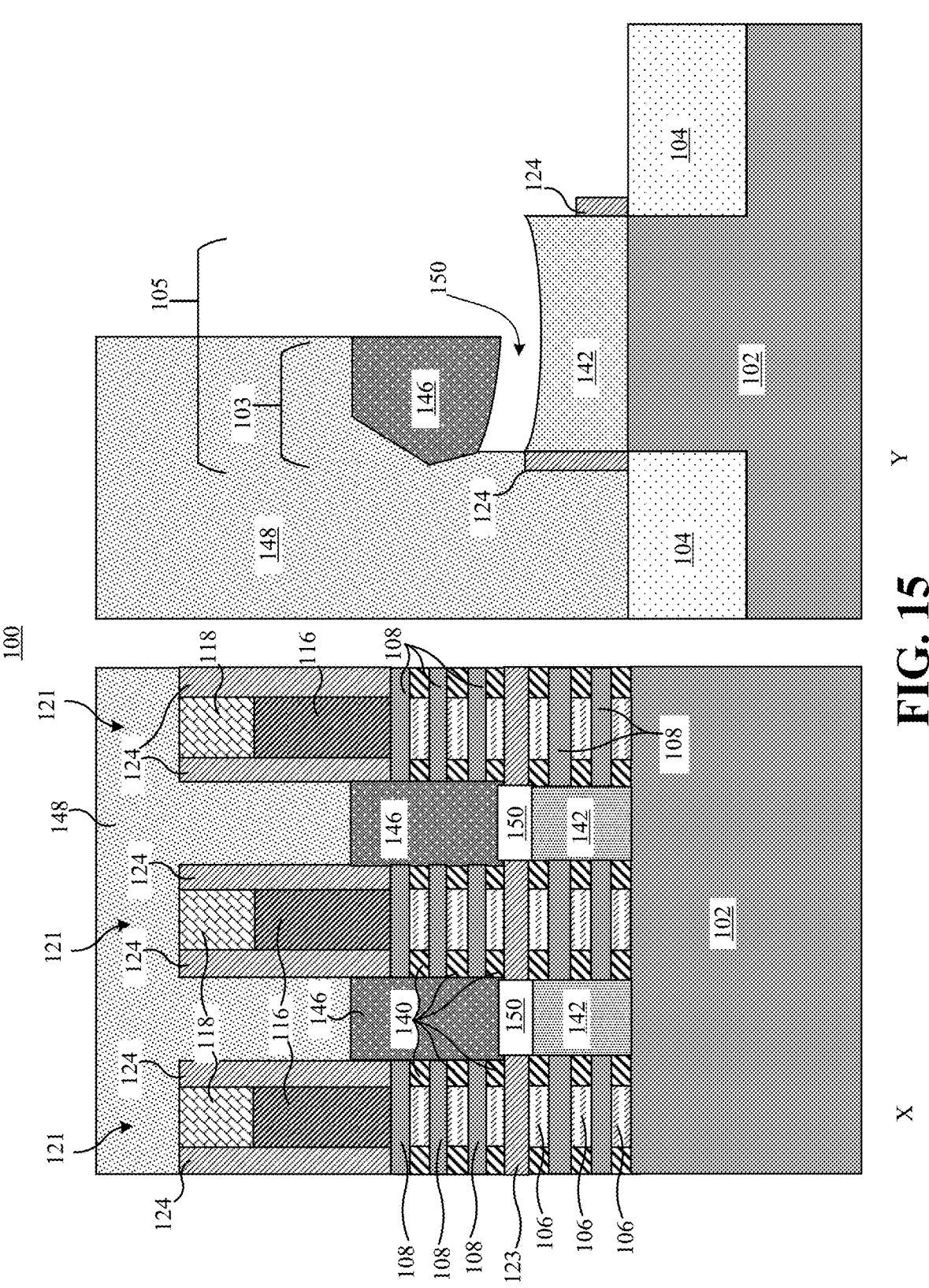

FIG. 15 depicts cross-sectional views of semiconductor IC device 100 shown after exemplary fabrication operation(s), in accordance with one or more embodiments. In the depicted fabrication stage, as depicted in the Y-view, a cavity 150 is formed between the bottom S/D region 142 and the top S/D region 146 by removing the associated sacrificial S/D region 144. The cavity 150 may be further formed, as depicted in the X-view, between the respective MDI 123 that are underneath neighboring and different sacrificial gate structures 121 by removing the associated sacrificial S/D region 144. In some examples, the sacrificial S/D region 144 is removed by a subtractive removal technique, such as etching, or the like. For example, sacrificial S/D region 144 may be selectively removed between the bottom S/D region 142 and the top S/D region 146, such that the sacrificial S/D region 144 is removed without also removing the bottom S/D region 142, the top S/D region 146, spacer(s) 124, STI region(s), mask 148, MDI 123, and/or the like. Subsequently, mask 148 may be removed by subtractive removal techniques such as etching, OPL ashing, or the like.

Figure 16:
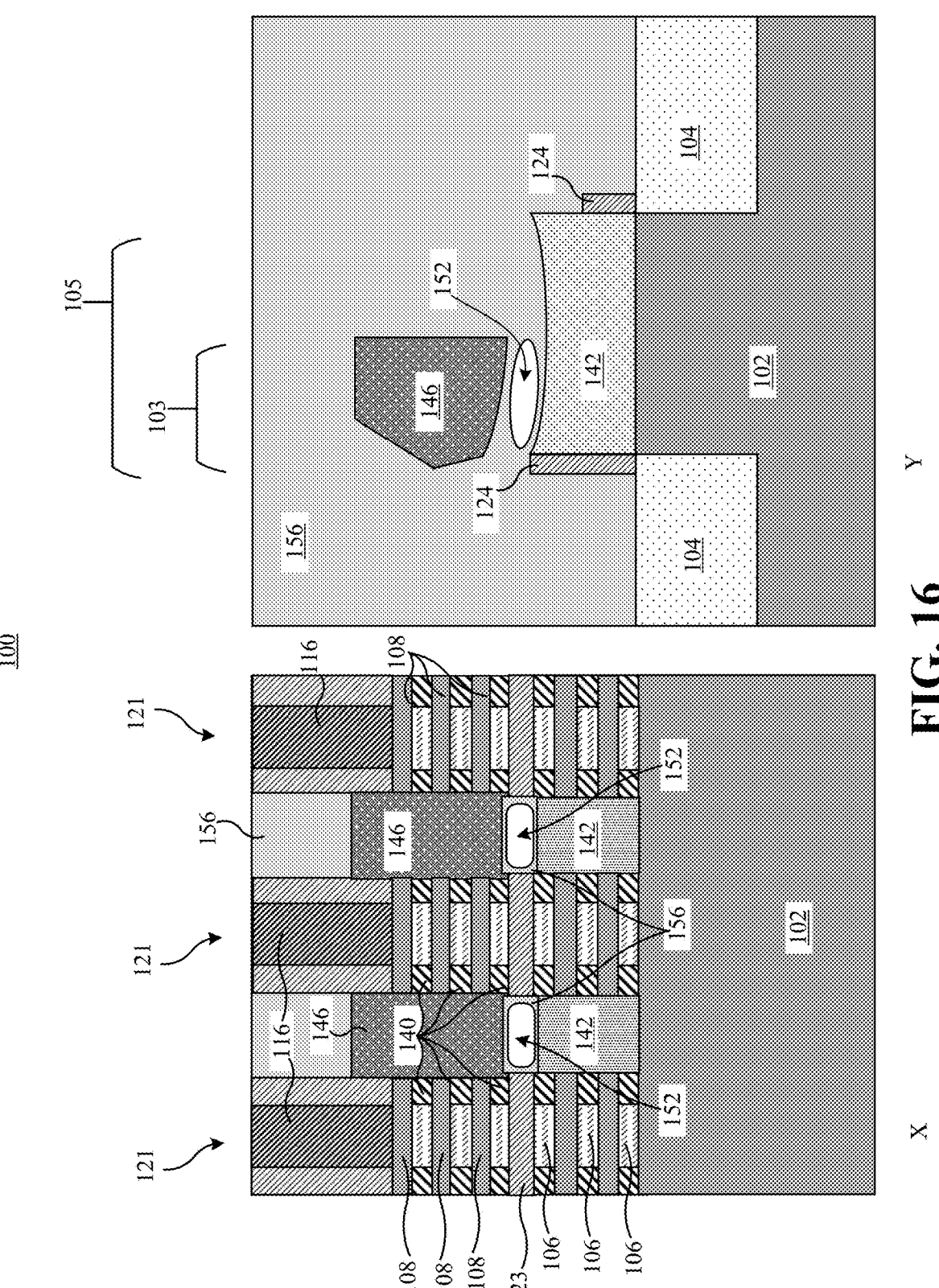

FIG. 16 depicts cross-sectional views of semiconductor IC device 100 shown after exemplary fabrication operation(s), in accordance with one or more embodiments. In the depicted fabrication stage, an air pocket 152 is formed within an associated region of cavity 150 between the bottom S/D region 142 and the top S/D region 146.

Air pocket 152 may be a material void or airgap and is present between the top S/D region 146 of top transistor region 103 and the bottom S/D region 142 of bottom transistor region 142. The air pocket 152 may reduce the propensity of electrical contact or connection between top S/D region 146 and bottom S/D region 142.

In some embodiments, the air pocket 152 results from a deposition process of interlayer dielectric (ILD) 156 in combination with a predefined relationship between the vertical spacing between top S/D region 146 and bottom S/D region 142 and a horizontal width between respective MDI 123 that are underneath neighboring and different sacrificial gate structures 121. For example, when the vertical spacing is sufficiently small compared to the horizontal width, ILD 156 material accumulating on the sides of the MDI 123 may accumulate more quickly than on the adjacent surfaces, enabling the material to build up and close on itself. As such, ILD 156 may fail to occupy the region between top S/D region 146 and bottom S/D region 142. As such, air pocket 152 may be encapsulated by adjacent gate structures between vertically adjacent S/D regions. In some embodiments, the horizontal width of the air pocket 152 (e.g., as shown in the X-view) is equal to or less than the cross-sectional width of the top S/D region 146 and/or bottom S/D region 142.

Different instances of air pocket 152 can have differences in shape, size, spacing, or the like to independently improve or optimize performance in an associated (i.e., vertically above/below) top S/D region 146 and/or bottom S/D region 142.

Note that while referred to as an "air pocket" in this description, the air pocket 152 may contain gases different from those commonly associated with air and its composition. As such, air pocket 152 can also be referred to as a void, a gas bubble, or other terminology. Also, the void or air pocket 152 can be distinguished from small imperfections that may be randomly positioned throughout a material, the void or air pocket 152 based on having a significantly greater size and being aligned between vertically adjacent top S/D region 146 and bottom S/D region 142. For example, the void or air pocket 152 has a cross-sectional size of at least 1 nm wide by 1 nm tall in some embodiments. In other embodiments, the air pocket 152 has a horizontal dimension of at least half that of the associated top S/D region 146 and/or bottom S/D region 142. Further, while illustrated in the X-view, as having a rectangular cross-sectional shape, such shape may not represent the actual shape and the void or air pocket 152 can have other cross-sectional shapes, including round, rectangular with rounded corners, trapezoidal, oval, and irregular shapes. In an example, the air pocket 152 may be aligned with respective side surfaces of the top S/D region 146. For example, as depicted in the Y-view, a left sidewall of the air pocket 152 may be aligned with a left side surface of the top S/D region 146 and/or a right sidewall of the air pocket 152 may be aligned with a right side surface of the top S/D region 146, or the like.

The air pocket 152 may reduce the parasitic capacitance between vertically adjacent top S/D region 146 and bottom S/D region 142, may reduce the parasitic capacitance between the replacement gate structure 135 and the top S/D region 146, and/or may reduce the parasitic capacitance between the replacement gate structure 135 and the bottom S/D region 142. Reduction of such parasitic capacitance(s) may improve performance of the semiconductor IC device 100 and may allow for further semiconductor IC device scaling.

The ILD 156 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 156 can be utilized. The ILD 156 can be formed using, for example, CVD, PECVD, ALD, flowable CVD, spin-on dielectrics, or PVD.

In an embodiment, ILD 156 may be formed to a thickness above the sacrificial gate structures 121 and subsequently planarized by a subtractive removal technique, such as a CMP. This subtractive removal technique may further remove the sacrificial gate caps 118 and may expose the sacrificial gates 116 within the sacrificial gate structures 121.

Figure 17:
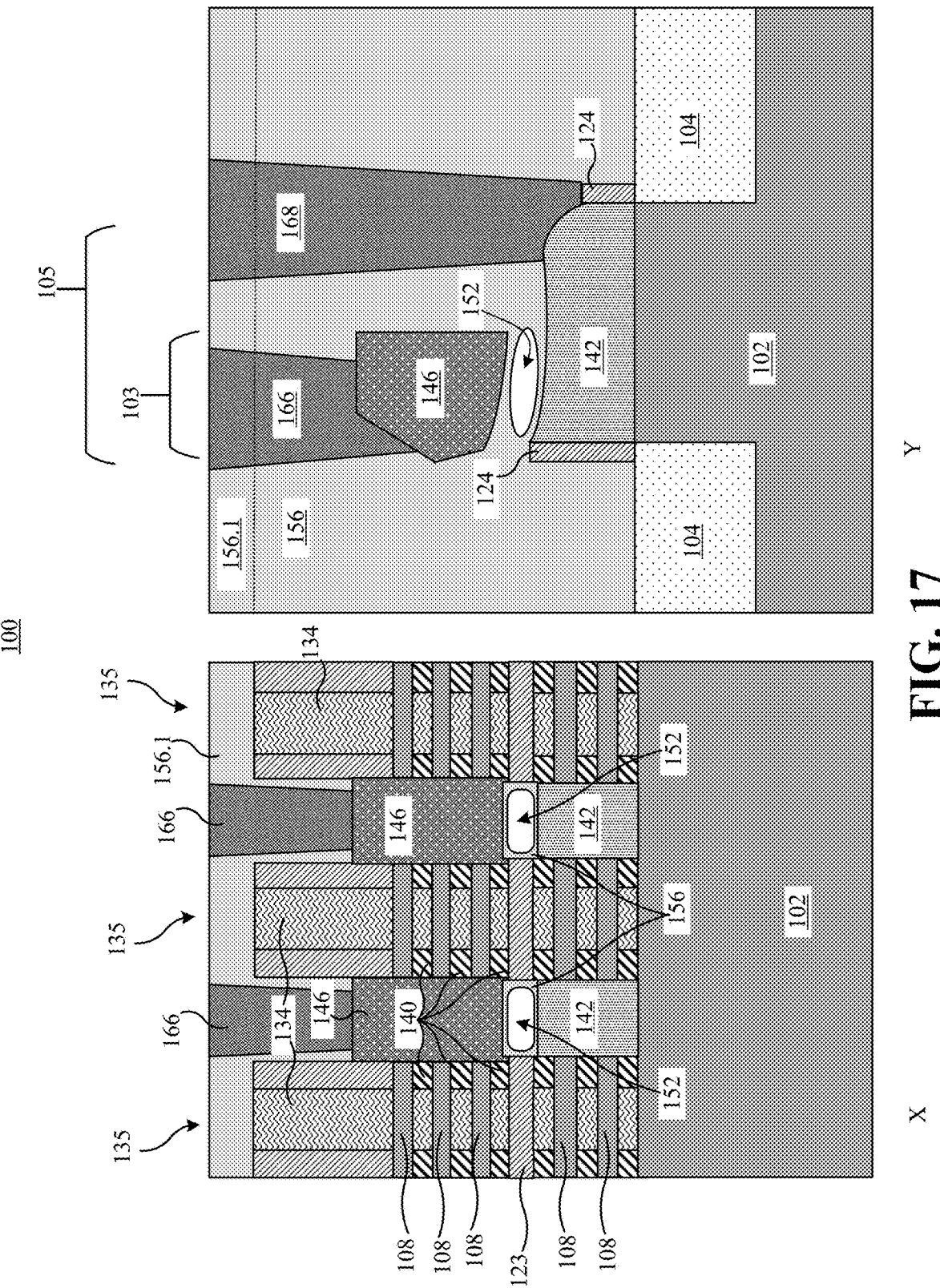

FIG. 17 depicts cross-sectional views of semiconductor IC device 100 shown after exemplary fabrication operation(s), in accordance with one or more embodiments. In the depicted fabrication stage, the sacrificial gate structure(s) 121 are removed and a respective replacement gate structure 135 is formed. Further in the fabrication stage, ILD 156.1 is formed upon the replacement gate structure(s). Even further in the fabrication stage, one or more S/D contact(s) 166 and one or more S/D contact(s) 168 are formed.

The sacrificial gate structures 121 may be removed by removing associated portions of sacrificial gate cap 118 (if not already absent), sacrificial gate 116, sacrificial gate oxide (if present), and the sacrificial nanolayers 106 by a subtractive removal technique, such as one or more series of etches. For example, such removal may be accomplished by an etching process which may include a dry etching process such as RIE, plasma etching, ion etching or laser ablation. The etching can further include a wet chemical etching process in which one or more chemical etchants are used to remove the associated portions of sacrificial gate cap 118, sacrificial gate 116, sacrificial gate oxide, and/or the sacrificial nanolayers 106.

After the removal of sacrificial nanolayers 106, void spaces between the active semiconductor nanolayers 108 and/or MDI 123 are formed. It should be appreciated that during the removal of the sacrificial gate 116, the sacrificial oxide layer, the sacrificial nanolayers 106, the sacrificial nanolayers 106, and/or the like, appropriate etchants are used that do not significantly remove material of active semiconductor nanolayers 108. substrate 102, inner spacers 140, MDI 123, or the like. The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane (CF4), nitrogen trifluoride (NF3), sulfur hexafluoride (SF6), and helium (He), and Chlorine trifluoride (CIF3). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane (CF4), and gas mixture with hydrogen (H2). Chemical vapor etching can be performed by CVD with suitable pressure and temperature.

The replacement gate structure 135 may be formed by initially forming an interfacial layer (not shown) on the interior surfaces of the spacer(s) 124 and the interior surfaces of the active semiconductor nanolayers 108, the inner spacers 140, or the like. Then, a high-κ layer (not shown) may be formed to cover the surfaces of exposed surfaces of the interfacial layer. The high-κ layer can be deposited by any suitable techniques, such as ALD, CVD, metal-organic CVD (MOCVD), physical vapor deposition (PVD), thermal oxidation, combinations thereof, or other suitable techniques. A high-κ material is a material with a higher dielectric constant than that of SiO2, and can include e.g., LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr) TiO3 (BST), Al2O3, Si3N4, oxynitrides (SiON), or other suitable materials. The high-κ layer can include a single layer or multiple layers, such as metal layer, liner layer, wetting layer, and adhesion layer. In other embodiments, the high-κ layer can include, e.g., Ti, Ag, Al, TiAlN, TaC, TaCN, TaSiN, Mn, Zr, TiN, TaN, Ru, Mo, Al, WN, Cu, W, or any suitable materials.

Replacement gate structure 135 may be further formed by depositing a work function (WF) gate (not shown) upon the high-κ layer. The WF gate can be comprised of metals, such as, e.g., copper (Cu), cobalt (Co), aluminum (Al), platinum (Pt), gold (Au), titanium (Ti), nitride (N) or any combination thereof. The metal can be deposited by a suitable deposition process, for example, chemical vapor deposition (CVD), plasma enhanced chemical vapor deposition (PECVD), physical vapor deposition (PVD), plating, thermal or e-beamF evaporation, or sputtering. In general, the work function (WF) gate sets the threshold voltage (Vt) of the stacked transistors associated with the active semiconductor nanolayers 108 within the lower transistor region 105 and the upper transistor region 103. The high-κ layer can separate the WF gate and the active semiconductor nanolayers 108. The WF gate may be formed to a thickness to generally fill the gaps between active semiconductor nanolayers 108.

Replacement gate structure 135 may be further formed by depositing a conductive fill gate 134 upon the WF gate. The conductive fill gate 134 can be comprised of metals, such as but not limited to, e.g., tungsten, aluminum, ruthenium, rhodium, cobalt, copper, tantalum, titanium, carbon nanowire materials including graphene, or the like. The metal can be deposited by a suitable deposition process, for example, chemical vapor deposition (CVD), plasma enhanced chemical vapor deposition (PECVD), physical vapor deposition (PVD), plating, thermal or e-beam evaporation, or sputtering. Subsequent to the replacement gate structure 135 formation, the top surface of the semiconductor IC device 100 may be planarized by a planarization technique such as a CMP.

Also, at the present stage of fabrication, ILD 156.1 is formed, one or more bottom S/D contact(s) 168 are formed, and one or more top S/D contact(s) 166 are formed.

The ILD 156.1 may be formed upon respective top surfaces of replacement gate structure 135 and ILD 156. The ILD 156.1 may be formed by depositing a dielectric material, such as, for example, porous silicates, carbon doped oxides, silicon dioxides, silicon nitrides, silicon oxynitrides, or other dielectric materials. Any appropriate deposition technique for forming the ILD 156.1 can be utilized. The ILD 156.1 can be formed using, for example, CVD, PECVD. ALD, flowable CVD, spin-on dielectrics, or PVD.

The bottom S/D contact(s) 168 may be formed by forming respective contact openings within ILD 156.1. ILD 156, or the like, stopping at or within a respective bottom S/D region 142. The bottom S/D contact(s) 168 may be in direct or indirect physical and electrical contact with the respective bottom S/D region 142 there below. The bottom S/D contact(s) 168 may be in direct or indirect physical contact with a top surface and/or side surface of spacer 124 that is not within upper transistor region 103.

The top S/D contact(s) 166 may be formed by forming respective contact openings within ILD 156.1, ILD 156, or the like, stopping at or within a respective top S/D region 146. The top S/D contact(s) 168 may be in direct or indirect physical and electrical contact with the respective top S/D region 146 there below.

The contact openings may be formed by the same or shared lithography and etch process, or sequential lithography and etch processes. In such process(es), a mask may be applied and patterned. An opening in the patterned mask may expose the portion of the underlying ILD 156.1 to be removed while other protected portions of semiconductor device 100 thereunder may be protected and retained. In such process(es), the dry and wet etching processes can have etching parameters that can be tuned, such as etchants used, etching temperature, etching solution concentration, etching pressure, source power, RF bias voltage, RF bias power, etchant flow rate, and other suitable parameters and selective materials are utilized to promote the etchant for desired material removal.

The bottom S/D contact(s) 168 and top S/D contact(s) 166 may be further formed by depositing conductive material such as metal into the respective contact openings. In an example, bottom S/D contact(s) 168 and top S/D contact(s) 166 may be formed by depositing a silicide liner, such as Ni, NiPt or Ti, etc. into the contact openings, depositing a metal adhesion liner, such as TiN, TaN, etc. upon the silicide liner, and by depositing a conductive metal fill, such as Al, Ru, W, Co, Cu, etc. upon the metal adhesion liner. Subsequently, a planarization process, such as a CMP process or a mechanical grinding process, may remove excess portions of the conductive barrier layer and the conductive material. Subsequently, the respective top surfaces of bottom S/D contact(s) 168, top S/D contact(s) 166 and ILD 156.1 may be coplanar. In some examples, bottom S/D contact(s) 168 and top S/D contact(s) 166 may be formed during middle of the line (MOL) processes.

For clarity, semiconductor IC device 100 may include a bottom transistor in the bottom transistor region 105 and a top transistor in the top transistor region 103. The top transistor is vertically stacked, or aligned, with respect to the bottom transistor. The air pocket 152 is located between and may be vertically aligned with the top S/D region 146 of the top transistor and the bottom S/D region 142 of the bottom transistor. As depicted in the X-view, the top S/D region 146, the bottom S/D region 142, and the air pocket 152 may be vertically aligned.

In an example, the top S/D region 146 of the top transistor and the bottom S/D region 142 of the bottom transistor are electrically isolated from each other. In an example. the top transistor and the bottom transistor have a different polarity. For example, the top transistor is a nFET transistor and the bottom transistor is a pFET transistor, or vice versa. In an example, the top transistor and the bottom transistor share a common gate 109. In an example, air pocket 152 edges or sides may be aligned to respective sidewalls of the top S/D region 146 of the top transistor. In an example, as depicted in the Y-view, the ILD 156 material is the same on both the right side and the left side of air pocket 152. In an example, the entire boundary of the air pocket 152, or that defines the air pocket 152, is formed by the material of ILD 156. For example, the air pocket 152 is enclosed by the same ILD 156 material and/or instance. In an example, as depicted in the Y-view, a width of bottom S/D region 142 that corresponds to the channel width 111 of the bottom transistor is larger than a width of top S/D region 146 that corresponds to the channel width 113 of the top transistor.

IC device 100 may be an integrated circuit (IC) chip. IC chips can be distributed by the fabricator in raw wafer form (that is, as a single wafer that has multiple unpackaged chips), as a bare die, or in a packaged form. In the latter case, the IC chip may mount in a single chip package (such as a plastic carrier, with leads that are affixed to a motherboard or other higher level carrier) or in a multichip package (such as a ceramic carrier that has either or both surface interconnections or buried interconnections). In any case, the IC chip may be integrated with other chips, discrete circuit elements, and/or other signal processing devices as part of either (a) an intermediate product, such as a motherboard, or (b) an end product. The end product can be any product that includes the IC chip, ranging from toys and other low-end applications to advanced computer products having a display, a keyboard or other input device, and a central processor.

FIG. 18 depicts a flow diagram illustrating method 200 of fabricating semiconductor IC device 100 that includes air pocket 152 between vertically stacked top S/D region 146 and bottom S/D region 142, according to one or more embodiments of the present disclosure. The depicted fabrication operations of method 200 are illustrated and described above with reference to one or more of FIG. 1 through FIG. 17 of the drawings. The method 200 depicted herein is exemplary. There can be many variations to the diagram or operations described therein without departing from the spirit of the embodiments. For instance, the operations can be performed in a differing order, or operations can be added, deleted, or modified.

At block 202, method 200 may include forming one or more nanolayer stacks 125 upon a substrate 102, may further include forming one or more shallow trench isolation (STI) region(s) 104 upon the substrate 102 next to a respective nanolayer stack 125, and/or may further include forming one or more sacrificial gate structures 121 upon the STI regions 104 around the one or more nanolayer stacks 125.

At block 204, method 200 may include removing sacrificial nanolayer 107. Further at block 204, a middle dielectric isolation (MDI) and spacer layer 122 may be formed in place of the removed sacrificial nanolayer 107. The middle dielectric isolation (MDI) and spacer layer 122 may be formed upon STI region(s) 104, may be formed upon and around one or more nanolayer stack(s) 125, and may be formed upon and around the one or more sacrificial gate structure(s) 121. Further at block 204, undesired portions of MDI and spacer layer 122 may be removed while desired portions of MDI and spacer layer 122 may be retained. Undesired portions of MDI and spacer layer 122 may be removed by a directional ion etch. Retained portions thereof may form one or more spacer(s) 124 upon STI region 104 and upon and around the sidewalls of the one or more sacrificial gate structures 121. Similarly, retained portions thereof may form one or more spacer(s) 124 upon STI region 104 and upon and around the sidewalls of the one or more nanolayer stack(s) 125. Likewise, retained portions thereof may form MDI 123 between bottom transistor region 105 and top transistor region 103. Further at block 204, spacer(s) 126 may be formed upon the spacer(s) 124.

At block 206, method 200 may continue with forming one or more top source/drain (S/D) recesses 160. The one or more top S/D recesses 160 may be formed between sacrificial gate structures 121 by removing sacrificial nanolayer(s) 106 and by removing active nanolayer(s) 108 that are between spacer(s) 124 and MDI 123 within top transistor region 103, as depicted in the Y-view. The one or more S/D recesses 160 may be formed to a depth stopping at the MDI 123.

At block 208, method 200 may continue with removing the spacer(s) 124 and the MDI 123 that are between spacer(s) 126 and that are above bottom transistor region 105. Further at block 208, exposed portions of the spacer(s) 126 that are above bottom transistor region 105 may be removed. Further at block 208, one or more bottom S/D recesses 161 may be formed between sacrificial gate structures 121 by removing sacrificial nanolayer(s) 106 and by removing active nanolayer(s) 108 that are between spacer(s) 124 within bottom transistor region 105. The one or more S/D recesses 161 may be formed to a depth stopping at the STI regions 104 and/or the substrate 102.

At block 210, method 200 may continue with nanolayer stack 125 sacrificial nanolayer 106 indenting and inner spacer 140 formation. Portions of the sacrificial nanolayers 106 that are not covered by the sacrificial gate 116 and/or that are under the spacer(s) 124 may be directionally etched or otherwise removed. Subsequently, inner spacers 140 may be deposited in the indents or recesses that were previously formed into the sacrificial nanolayers 106.

At block 212, method 200 may continue with forming one or more bottom S/D regions 142 between spacer(s) 124, with forming a respective sacrificial S/D region 144 upon an underlying bottom S/D region 142, and with forming a respective top S/D region 146 upon an underlying sacrificial S/D region 144.

At block 214, method 200 may continue with partially recessing one or more top S/D regions 146 to expose a portion of the underlying sacrificial S/D region(s) 144 that is not within the top transistor region 103. Further at block 214 the spacer(s) 124 that are not within the top transistor region 103 may be pulled down or partially recessed.

At block 216, method 200 may continue with removing the sacrificial S/D region(s) 144 thereby forming cavity 150 between the bottom S/D region 142 and the top S/D region 146.

At block 218, method 200 may continue with forming air pocket 152 between the bottom S/D region 142 and the top S/D region 146 from a deposition process of interlayer dielectric (ILD) 156 in combination with a predefined relationship between the vertical spacing between top S/D region 146 and bottom S/D region 142 and a horizontal width between respective MDI 123 that are underneath neighboring and different sacrificial gate structures 121. For example, when the vertical spacing is sufficiently small compared to the horizontal width, ILD 156 material accumulating on the sides of the MDI 123 may accumulate more quickly than on the adjacent surfaces, enabling the material to build up and close on itself, which may also be known as pinching off.

At block 220, method 200 may continue with removing the one or more sacrificial gate structures 121, with removing the sacrificial nanolayers 106, with forming a replacement gate structure around the active semiconductor nanolayers 108 within the bottom transistor region 105 and around the active semiconductor nanolayers 108 within the top transistor region 103.

At block 222, method 200 may continue with forming ILD 156.1, with forming one or more bottom S/D contact(s) 168 that contact a respective bottom S/D region 142, and with forming one or more top S/D contact(s) 166 that contact a respective top S/D region 146.

The descriptions of the various embodiments of the present disclosure have been presented for purposes of illustration but are not intended to be exhaustive or limited to the embodiments described. Many modifications and variations will be apparent to those of ordinary skill in the art without departing from the scope and spirit of the disclosure. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor IC device comprising:
a bottom transistor and a top transistor vertically stacked above the bottom transistor;
an air pocket between a top source/drain (S/D) region of the top transistor and a bottom S/D region of the bottom transistor;
a first spacer on a first sidewall of the bottom S/D region; and
a second spacer on a second sidewall of the bottom S/D region, wherein a top surface of the first spacer is below a top surface of the second spacer.

2. The semiconductor IC device of claim 1, wherein the top S/D region, the air pocket, and the bottom S/D region are vertically aligned.

3. The semiconductor IC device of claim 1, wherein the top transistor and the bottom transistor have a different polarity.

4. The semiconductor IC device of claim 1, further comprising:
a gate that is shared by both the top transistor and the bottom transistor.

5. The semiconductor IC device of claim 1, wherein a first edge of the air pocket is aligned with a first sidewall of the top S/D region and wherein a second edge that is opposite facing to the first edge is aligned with a second sidewall of the top S/D region.

6. The semiconductor IC device of claim 5, further comprising:
a same interlayer dielectric (ILD) material upon the first sidewall of the top S/D region and upon the second sidewall of the top S/D region.

7. The semiconductor IC device of claim 6, wherein the same ILD material defines a boundary of the air pocket.

8. The semiconductor IC device of claim 1, wherein a channel width of the bottom transistor is larger than a channel width of the top transistor.

9. The semiconductor IC device of claim 8, wherein a width of the bottom S/D region that corresponds to the channel width of the bottom transistor is larger than a width of the top S/D region that corresponds to the channel width of the top transistor.

10. The semiconductor IC device of claim 1, wherein a top surface of the first spacer is coplanar with a top surface of the second spacer.

11. The semiconductor IC device of claim 1, further comprising:
a bottom S/D contact connected to the bottom S/D region and to the first spacer.

12. The semiconductor IC device of claim 11, further comprising:
a top S/D contact connected to the top S/D region.

13. The semiconductor IC device of claim 4, further comprising:
one or more top active semiconductor nanolayer channels connected to the top S/D region and to the gate; and
one or more bottom active semiconductor nanolayer channels connected to the bottom S/D region and to the gate.

14. The semiconductor IC device of claim 5, wherein the first sidewall of the top S/D region comprises a crystallographic surface and wherein the second sidewall of the top S/D region comprises an etched surface.

15. The semiconductor IC device of claim 14, wherein the etched surface is vertical.

16. The semiconductor IC device of claim 14, wherein the etched surface is straight.

17. A semiconductor IC device fabrication method:
forming a bottom source/drain (S/D) region upon a substrate;
forming a first spacer on a first sidewall of the bottom S/D region;
forming a second spacer on a second sidewall of the bottom S/D region, wherein a top surface of the first spacer is below a top surface of the second spacer;
forming a sacrificial S/D region upon the bottom S/D region;
forming a top S/D region upon the sacrificial S/D region;
removing the sacrificial S/D region; and
forming an interlayer dielectric (ILD) between the top S/D region and the bottom S/D region pinching off the ILD to form an air pocket between the top S/D region and the bottom S/D region.

18. The semiconductor IC device fabrication method of claim 17, wherein the top S/D region, the air pocket, and the bottom S/D region are vertically aligned.

* * * * *